United States Patent
Aburatani

(10) Patent No.: US 8,128,333 B2
(45) Date of Patent: Mar. 6, 2012

(54) SUBSTRATE PROCESSING APPARATUS AND MANUFACTURING METHOD FOR SEMICONDUCTOR DEVICES

(75) Inventor: Yukinori Aburatani, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 908 days.

(21) Appl. No.: 11/984,589

(22) Filed: Nov. 20, 2007

(65) Prior Publication Data

US 2008/0134483 A1 Jun. 12, 2008

(30) Foreign Application Priority Data

Nov. 27, 2006 (JP) ................................. 2006-318343
Nov. 9, 2007 (JP) ................................. 2007-291866

(51) Int. Cl.
*B65G 65/04* (2006.01)
(52) U.S. Cl. ......... 414/411; 414/217; 414/586; 414/804
(58) Field of Classification Search .................. 414/411, 414/586, 804
See application file for complete search history.

(56) References Cited

U.S. PATENT DOCUMENTS

| | | | |
|---|---|---|---|
| 5,772,386 A | 6/1998 | Mages et al. | 414/411 |
| 6,071,059 A | 6/2000 | Mages et al. | 414/411 |
| 6,375,403 B1 | 4/2002 | Mages et al. | 414/411 |
| 6,461,094 B1 | 10/2002 | Mages et al. | 414/217 |
| 6,609,876 B2 | 8/2003 | Mages et al. | 414/808 |
| 6,837,663 B2 | 1/2005 | Mages et al. | 414/411 |
| 7,114,903 B2 * | 10/2006 | Harris et al. | 414/222.01 |
| 7,604,449 B1 * | 10/2009 | Kaveh | 414/411 |
| 2002/0197145 A1 * | 12/2002 | Yamamoto et al. | 414/806 |
| 2003/0106571 A1 * | 6/2003 | Kamikawa et al. | 134/25.4 |

FOREIGN PATENT DOCUMENTS

| | | |
|---|---|---|
| JP | 2002-208622 | 7/2002 |
| JP | 2002-246436 | 8/2002 |
| JP | 2003-007801 | 1/2003 |
| JP | 2003-7801 | 1/2003 |
| JP | 2004-140011 | 5/2004 |
| JP | 3635061 | 1/2005 |
| JP | 2006-041074 | 2/2006 |

OTHER PUBLICATIONS

Office Action dated Apr. 30, 2009, corresponding to Korean patent Application No. 10-2007-0120211 with English translation.

(Continued)

Primary Examiner — Saul Rodriguez
Assistant Examiner — Willie Berry, Jr.
(74) Attorney, Agent, or Firm — Kratz, Quintos & Hanson, LLP

(57) ABSTRACT

A substrate processing apparatus comprises a storage container for storing multiple substrates and whose substrate loading and unloading opening is shut by a lid, a loading and unloading port for carrying the storage container into and out of the case, a placement unit for placing the storage container in the loading and unloading port, a storage chamber provided adjacent to the loading and unloading port for storing the storage container, an opening and closing device for opening and closing the substrate loading and unloading opening of the storage container placed in the placement unit, a transfer device containing a holding mechanism for supporting the bottom of the storage container and transferring the storage container supported in the holding mechanism, over the opening and closing device between the inside and outside of the storage chamber, and an elevator mechanism for raising and lowering the placement unit between the placement unit height position where the opening and closing device opens and closes the storage container, and a height position where the transfer device gives and receives the storage container.

8 Claims, 19 Drawing Sheets

OTHER PUBLICATIONS

Communication from the Japanese Patent Office mailed Oct. 19, 2010 with English translation (4 pages).

Japanese Office Action issued in counterpart application No. 2007-291866 mailed Sep. 20, 2011 with English translation (4 pages).

* cited by examiner

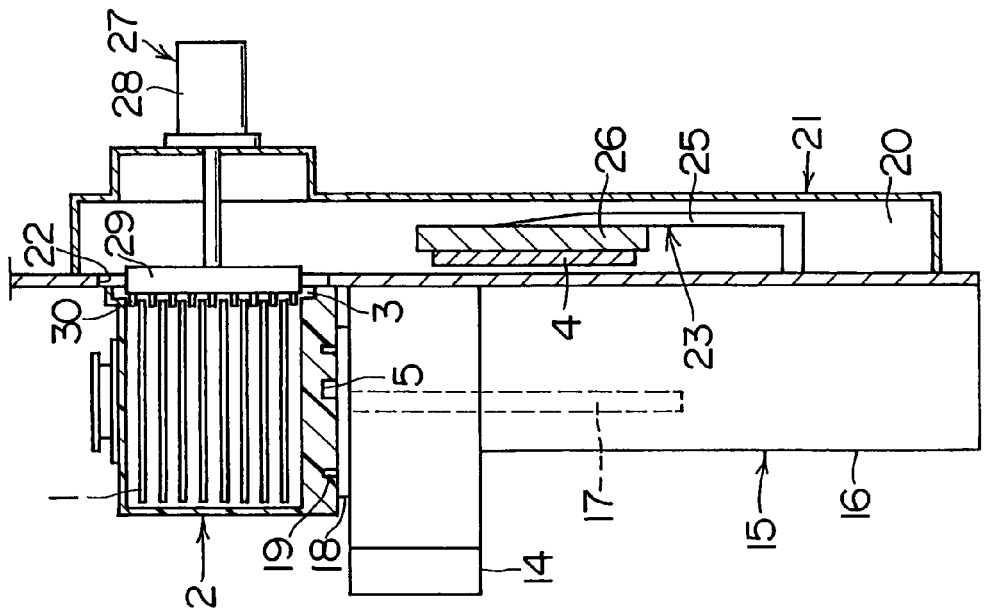
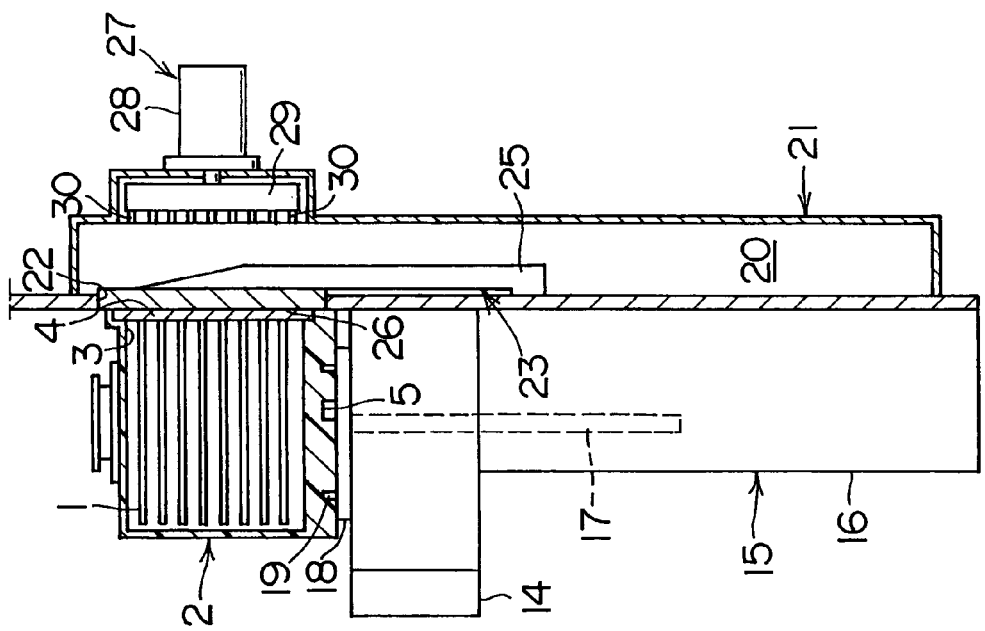

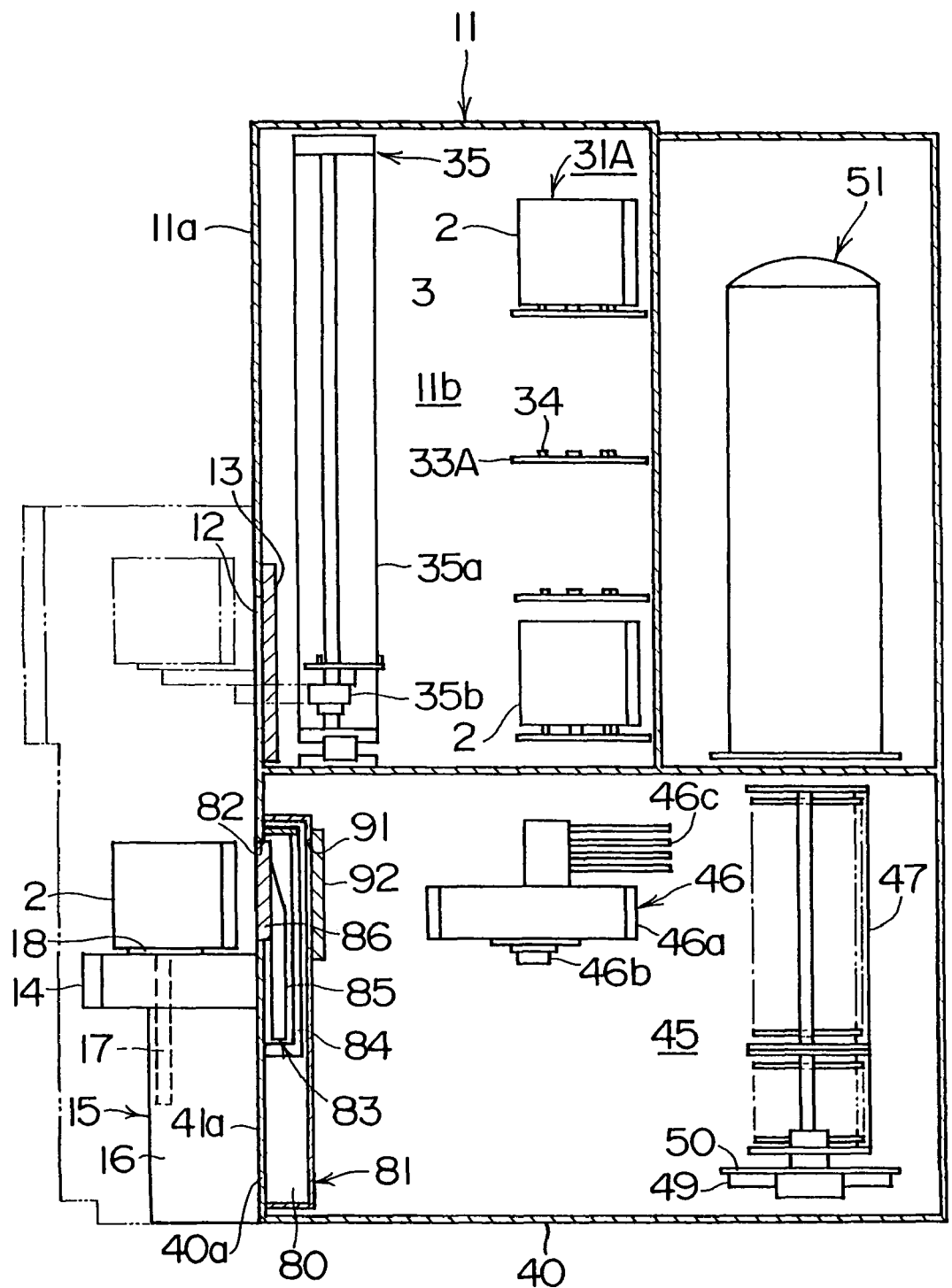
F I G. 7

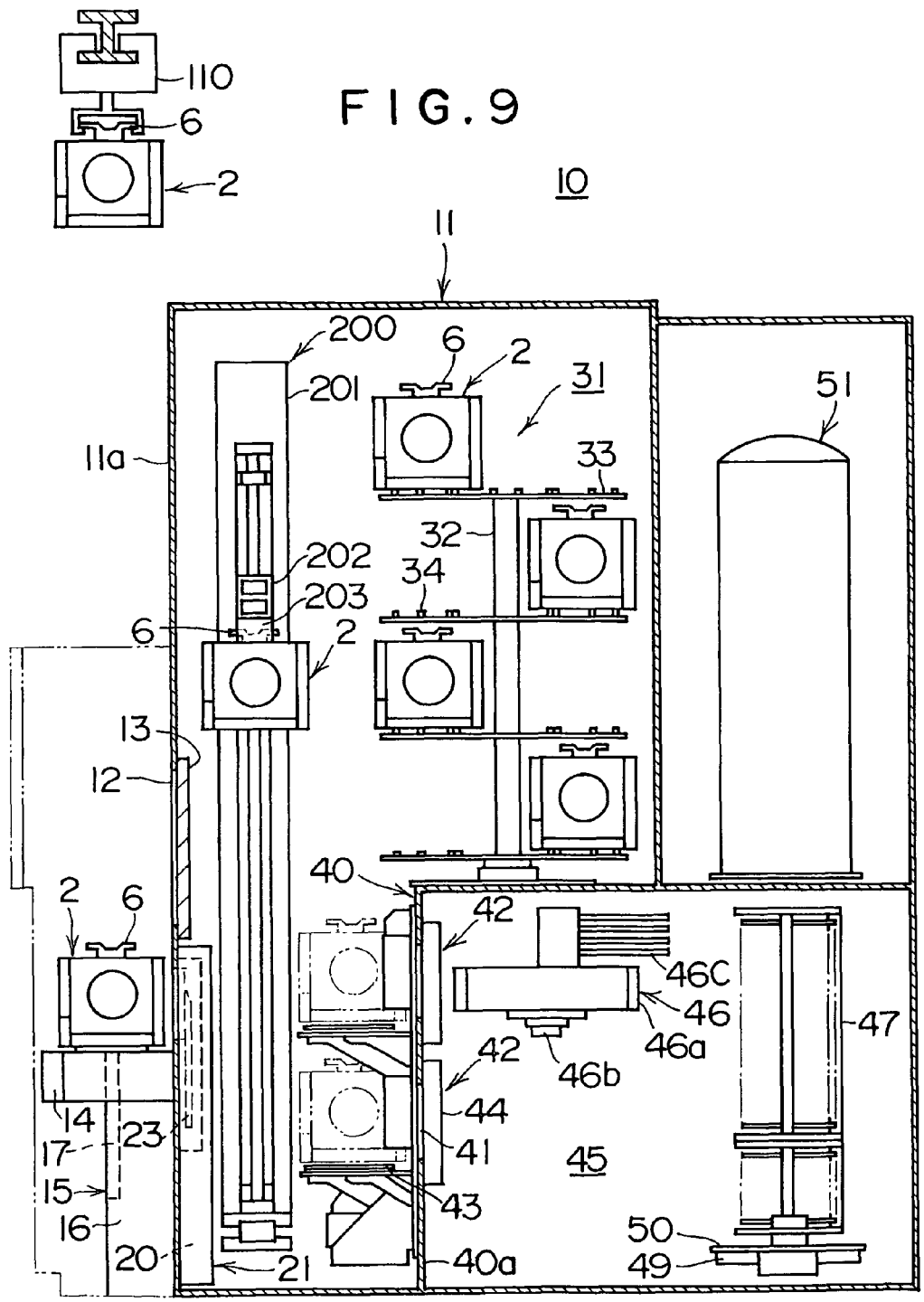

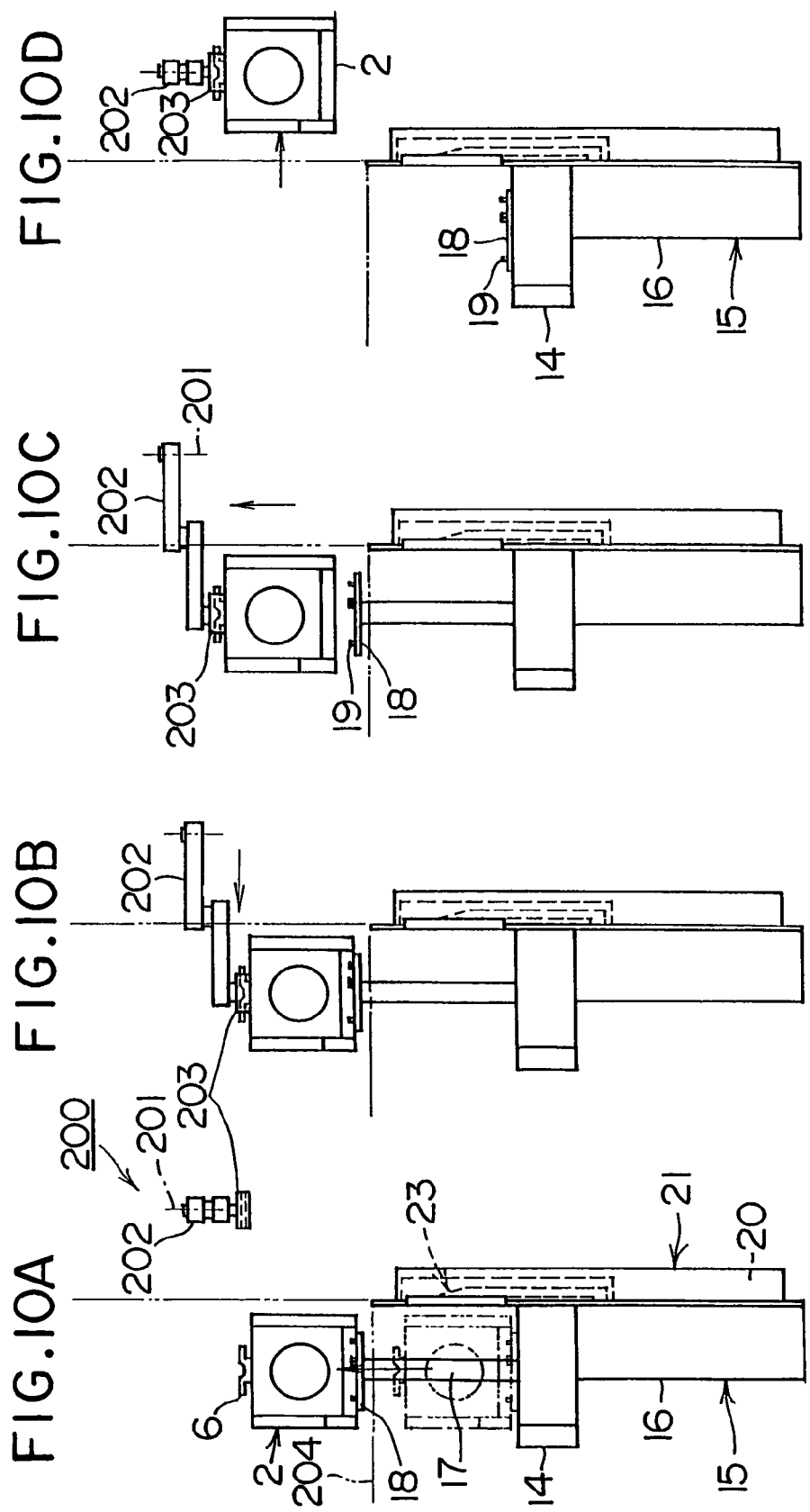

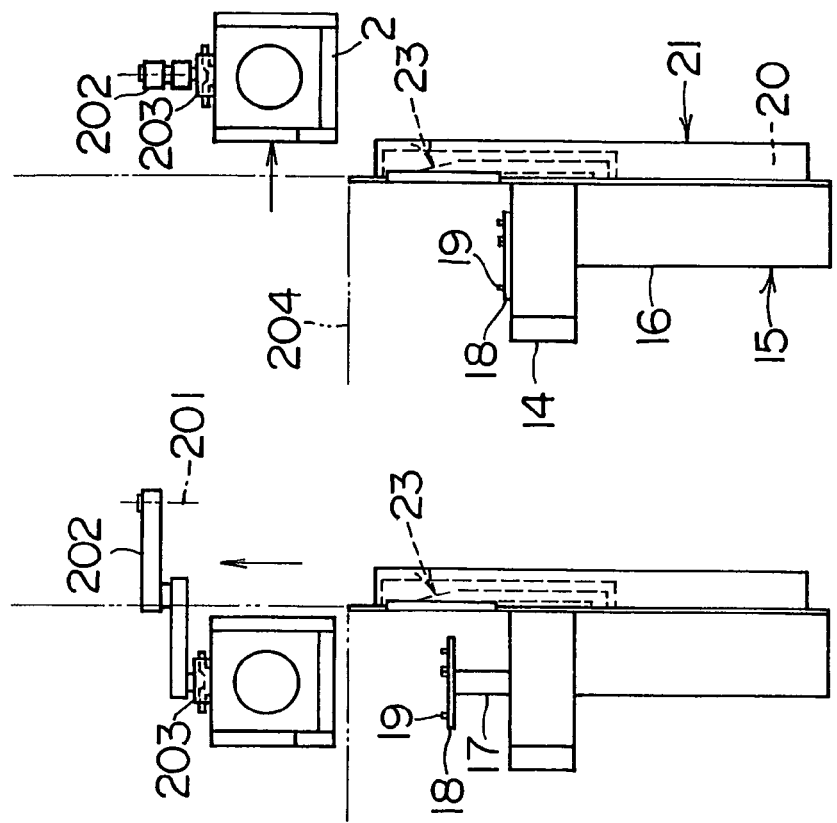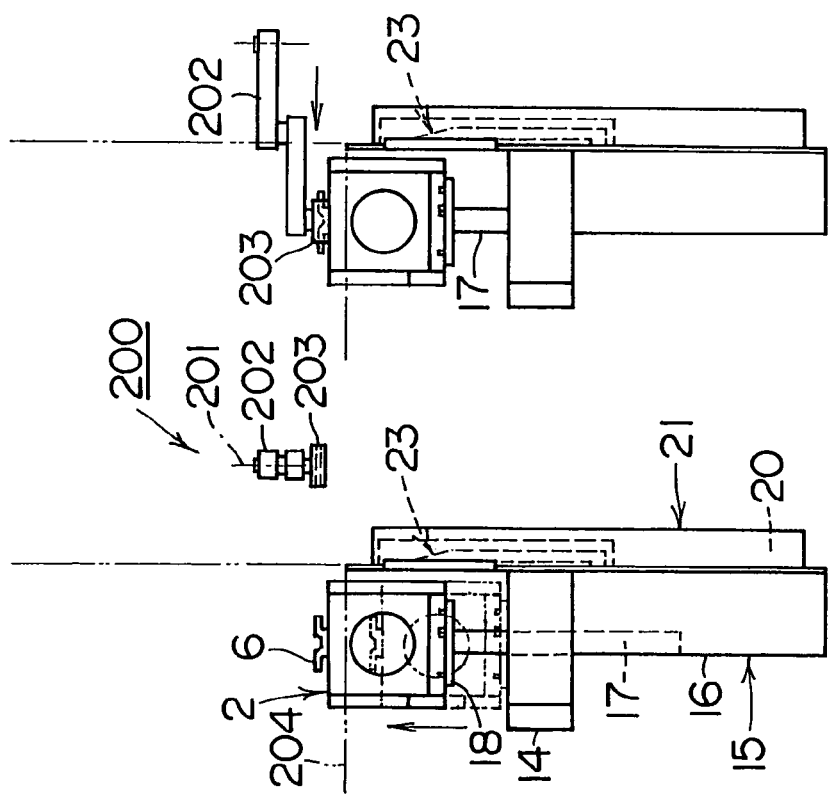

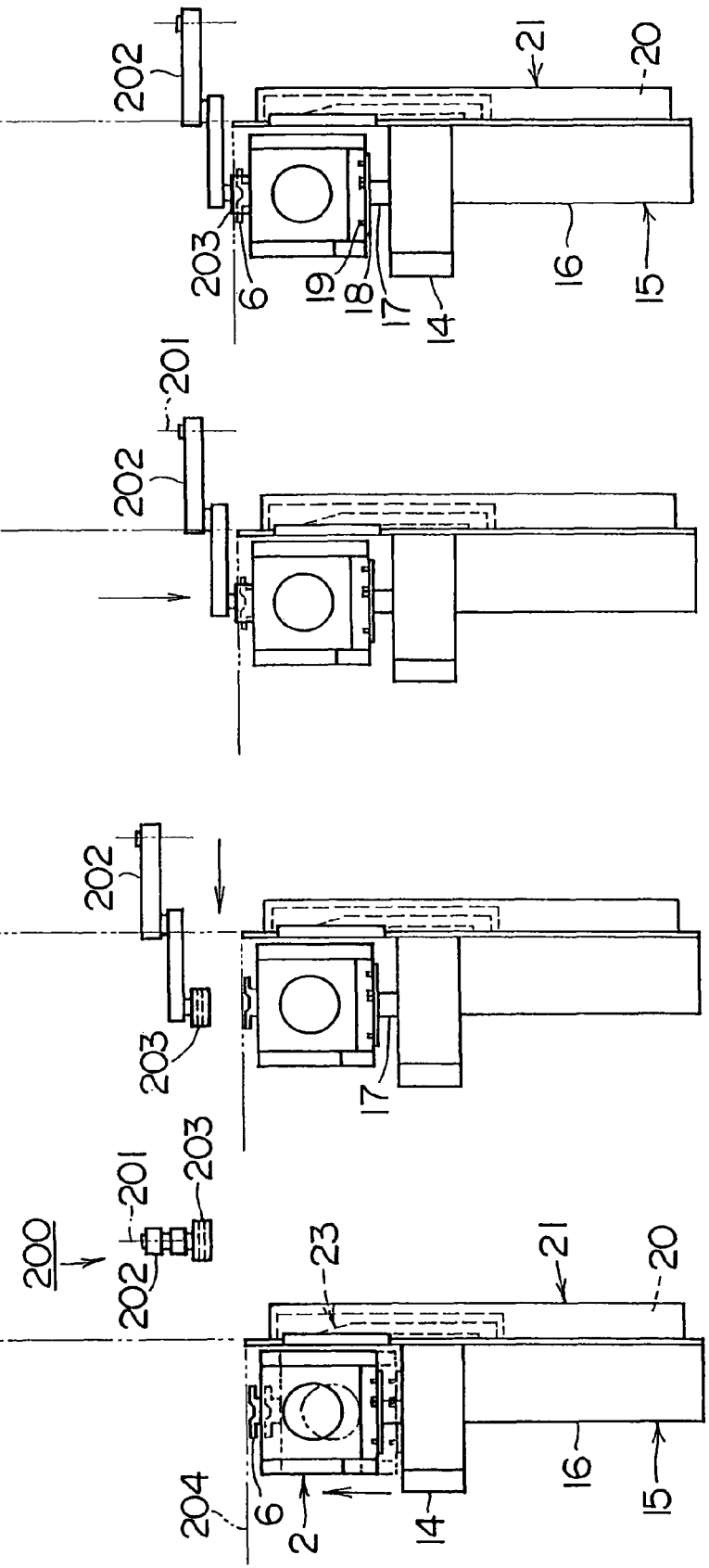

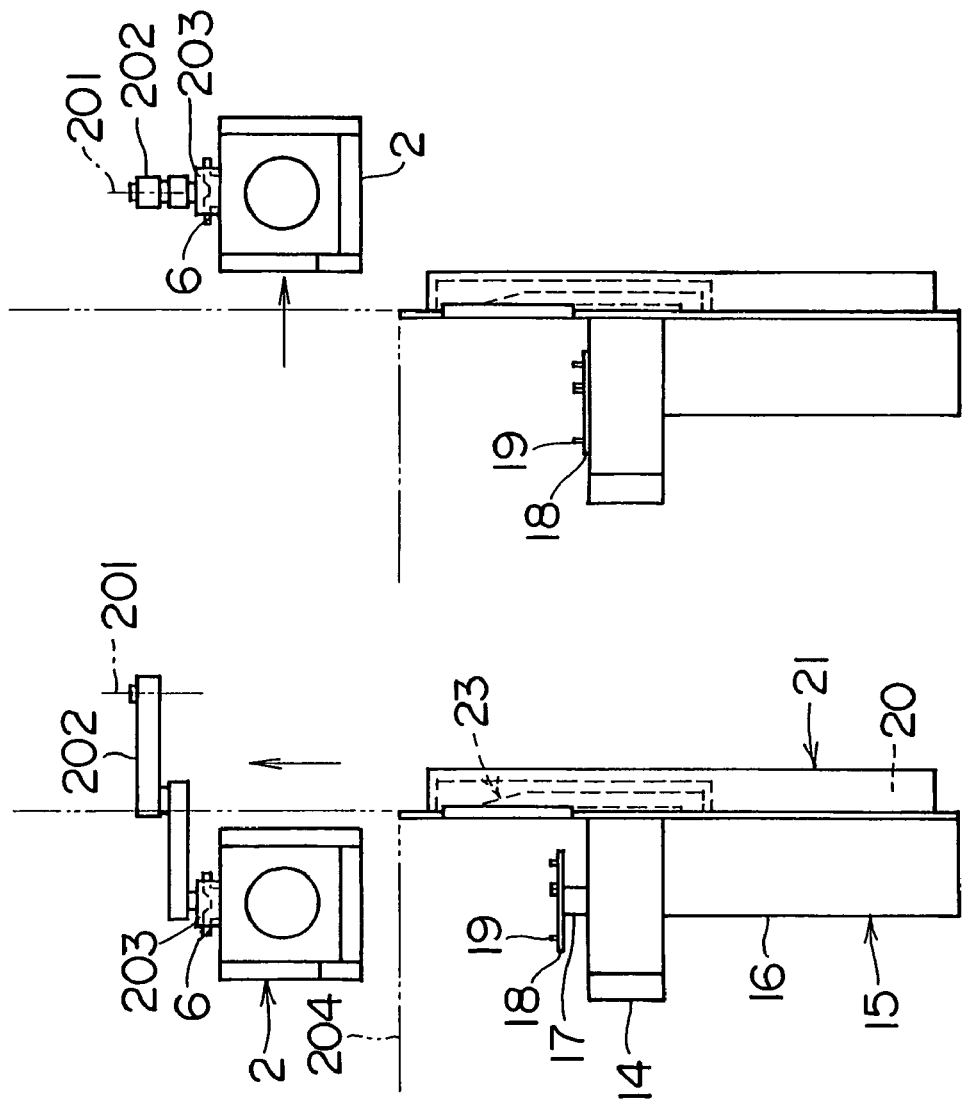

SUBSTRATE PROCESSING APPARATUS AND MANUFACTURING METHOD FOR SEMICONDUCTOR DEVICES

BACKGROUND OF INVENTION

1. Field of Invention

The present invention relates to a substrate processing apparatus and a semiconductor device manufacturing method.

The present invention for example is effective for use in a batch type vertical diffusion CVD apparatus for diffusing dopants or forming a thin film such insulating film, metallic film, or semiconductor film on semiconductor wafers (hereinafter called "wafers") on which semiconductor integrated circuits (hereinafter called "IC") are formed.

2. Description of Related Art

Batch type vertical diffusion CVD apparatus (hereinafter called "batch CVD apparatus") are one type of substrate processing apparatus that is utilized in a state where holding multiple wafers in a storage container.

The conventional storage container includes an open cassette, and a FOUP (front opening unified pod. hereinafter called "pod"). The open cassette is formed in a cubic parallelpiped box shape open on one pair of opposing sides. The pod is formed in a cubic parallelpiped box shape, open on one side, and fitted with detachable door on the open side.

The pod transfers the wafers in a sealed state. The pod can therefore maintain the wafer cleanliness within the pod even if particles are present in the atmosphere around the pod. Therefore, the interior of the clean room where the batch CVD apparatus is installed does not have to be kept at a high level of purity. Therefore, the cost required to maintain the clean room at a certain level of purity can be reduced.

Recent batch CVD apparatus use the pod as a storage container. These batch CVD apparatus contain a pod opening and closing device (hereinafter called "a pod opener") as well as a mapping device in the wafer transfer port for loading wafers into the pod and unloading wafers from inside the pod (See for example patent document 1).

The pod opener attaches or detaches the door to open or close the pod wafer loading and unloading opening. The mapping device detects whether or not the wafers are held in wafer holding grooves (slots) by detecting wafers within the pod.

Patent document 1: Japanese Patent Non-Examined Publication No. 2003-7801

Pod doors are not attachable or removable in the batch CVD apparatus of the prior art, in the loading and unloading port for carrying the pod outside the apparatus into the batch CVD apparatus case or carrying the pod from inside the case to outside the apparatus.

A structure containing a pod opener capable of retracting into the loading and unloading port would allow attaching or removing a pod door in the loading and unloading port. Namely, when carrying the pod from outside the case into the case, or carrying the pod from inside the case to outside the case, retracting the pod opener from the loading and unloading port makes a path available for carrying the pod in or out.

However, this concept has the problem that retracting the pod opener from the loading and unloading port makes the structure of the batch CVD apparatus complicated.

SUMMARY OF INVENTION

The present invention has an object of providing a semiconductor device manufacturing method and a substrate processing apparatus with a simple structure and capable of attaching and removing a pod door in the loading and unloading port for carrying the pod into and out of the case.

The aspect of the invention for resolving the aforementioned problems includes the following points.

A substrate processing apparatus comprising:

a storage container for storing multiple substrates and whose substrate loading and unloading opening is shut by a lid, a loading and unloading port for carrying the storage container into and out of the case, a placement unit for placing the storage container in the loading and unloading port, a storage chamber installed inside the case for storing the storage container, an opening and closing device for opening and closing the substrate loading and unloading opening of the storage container placed in the placement unit, a transfer device containing a holding mechanism for supporting the bottom of the storage container and transferring the storage container supported in the holding mechanism, over the opening and closing device between the inside and outside of the storage chamber, and an elevator mechanism for raising and lowering the placement unit between the placement unit height position where the opening and closing device opens and closes the storage container, and a height position where the transfer device gives and receives the storage container.

Installing an elevator mechanism in the above aspect allows the transfer device to transfer the storage container from the placement unit to inside the case over the opening and closing device so that besides smoothly transferring the storage container, the storage container can be moved without retracting the opening and closing device, and the lid on the storage container can be opened or closed in the loading and unloading port.

BRIEF DESCRIPTION OF DRAWINGS

FIG. 5A is an abbreviated side cross sectional view showing the function of the pod opener, and shows the state prior to removal of the door;

FIG. 5B is an abbreviated side cross sectional view showing the function of the pod opener, and shows the state during mapping;

FIG. 6 is an abbreviated side cross sectional view showing the state during pod carry-in;

FIG. 7 is a side cross sectional view showing the batch CVD apparatus as the second embodiment of the present invention;

FIG. 9 is a side cross sectional view showing the batch CVD apparatus as the fourth embodiment of the present invention;

FIG. 10A is a side view showing a first example of that operating method;

FIG. 10B is a side view showing a first example of that operating method;

FIG. 10C is a side view showing a first example of that operating method;

FIG. 10D is a side view showing a first example of that operating method;

FIG. 11A is a side view showing a second example of that operating method;

FIG. 11B is a side view showing a second example of that operating method;

FIG. 11C is a side view showing a second example of that operating method;

FIG. 11D is a side view showing a second example of that operating method;

FIG. 12A is a side view showing a third example of that operating method;

FIG. 12B is a side view showing a third example of that operating method;

FIG. 12C is a side view showing a third example of that operating method;

FIG. 12D is a side view showing a third example of that operating method;

FIG. 13A is a side view showing the continuance of that third example;

FIG. 13B is a side view showing the continuance of that third example;

DETAILED DESCRIPTION OF PREFERRED EMBODIMENTS

Figure 1:
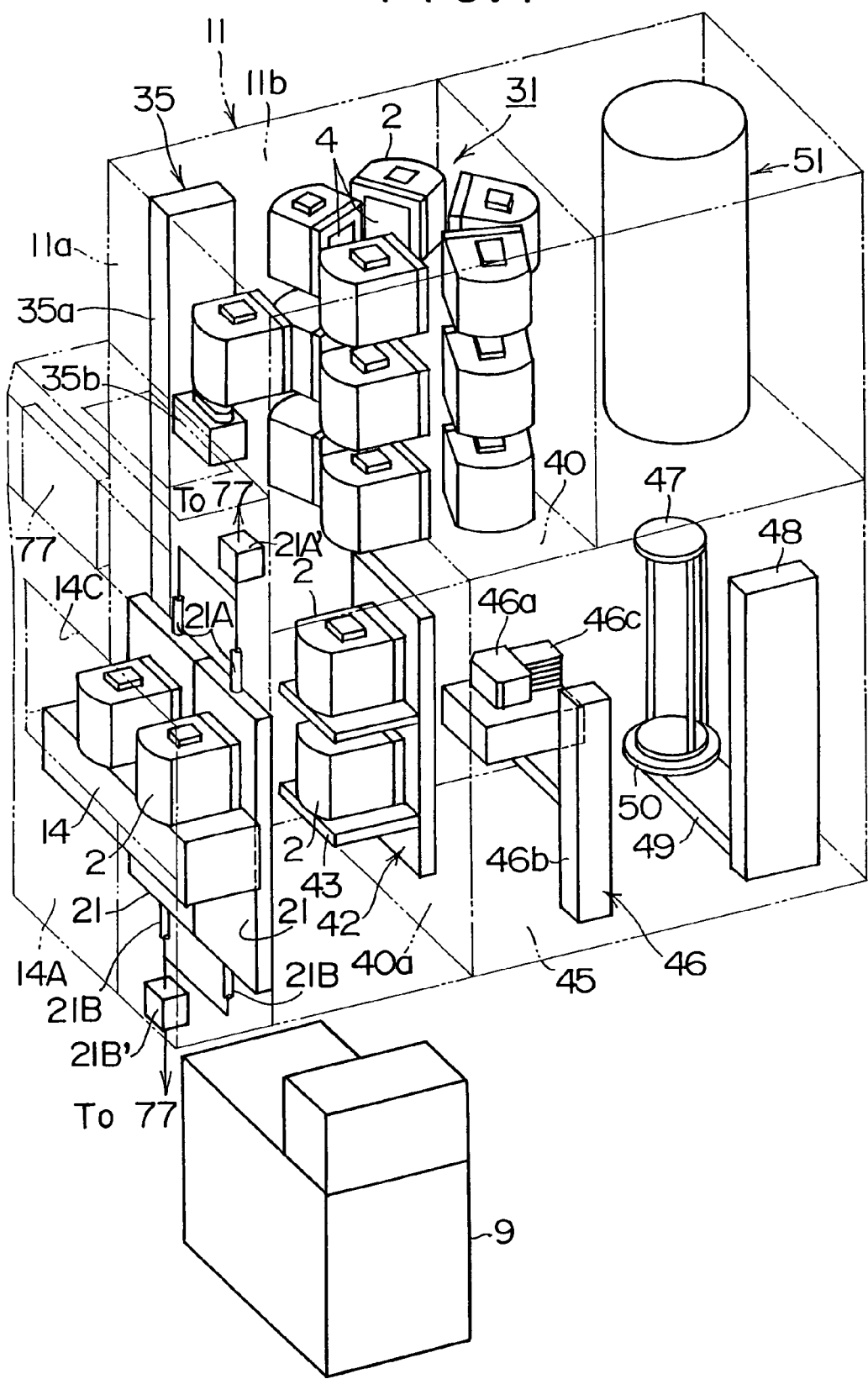
FIG. 1 is an abbreviated perspective view showing the batch CVD apparatus of the first embodiment of the present invention.

An embodiment of the present invention is described next while referring to the drawings.

Figure 2:
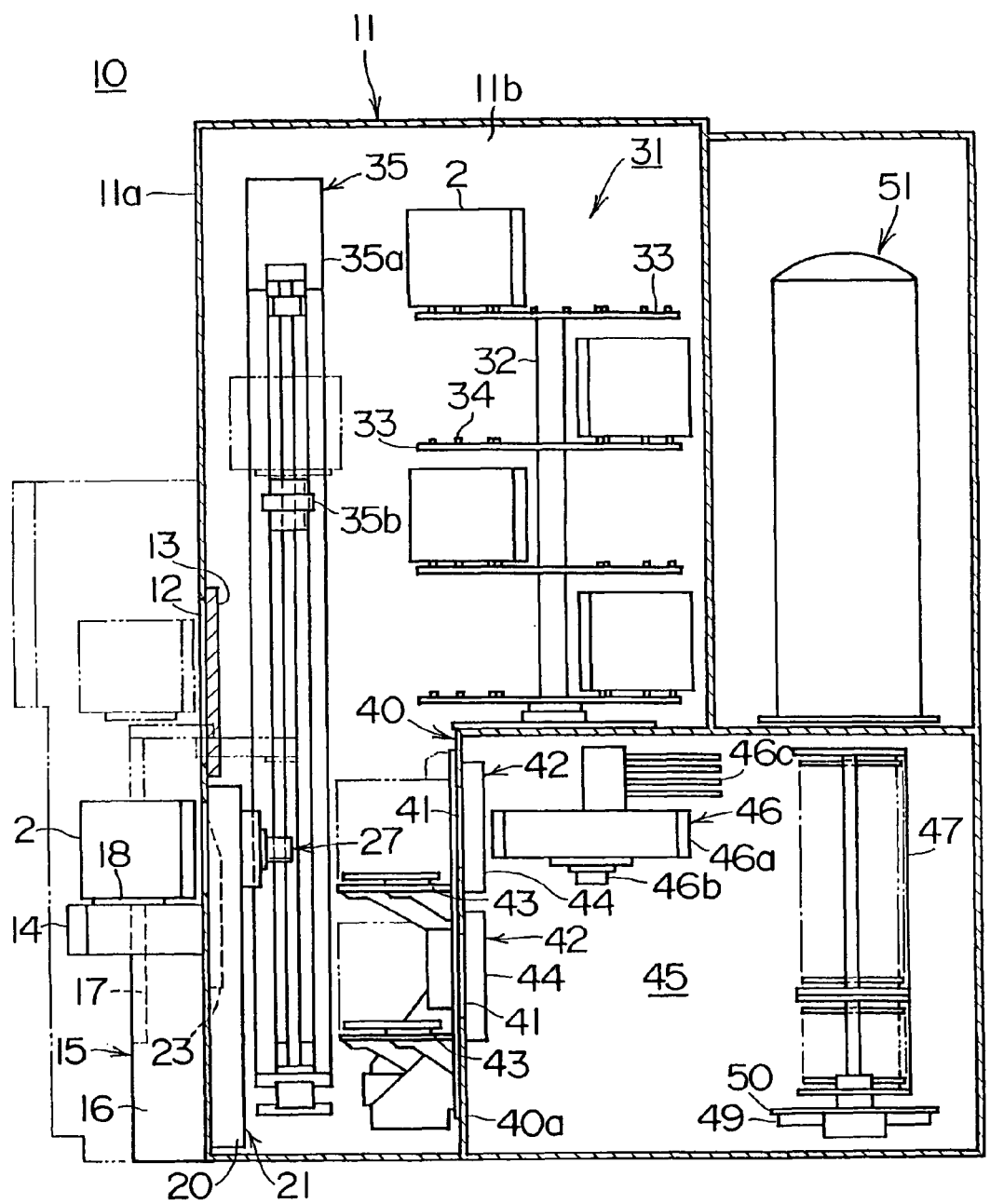
FIG. 2 is a side cross sectional view.

The substrate processing apparatus of this invention in this embodiment is a batch CVD apparatus, namely a batch type vertical diffusion CVD apparatus as shown in FIG. 1 and FIG. 2.

In this embodiment, a pod 2 is utilized as a storage container for storing wafers 1 serving as the substrates.

Figure 3:
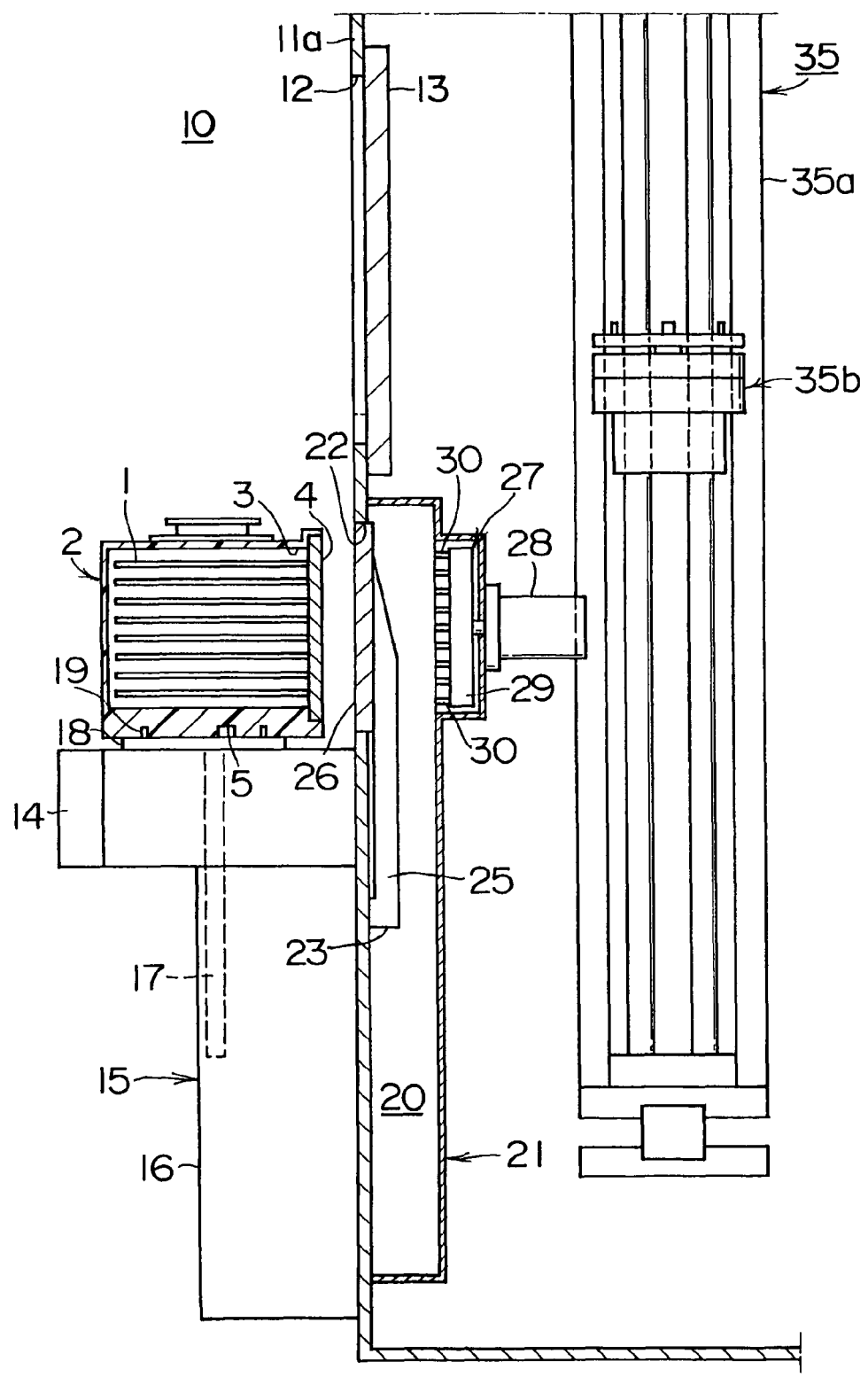
FIG. 3 is a side cross sectional view showing a major section.

The pod 2 is formed in a cubic parallelpiped box shape. A wafer loading and unloading opening 3 is formed on one side wall of the pod 2 as shown in FIG. 3. A detachable door 4 that functions as a lid is attached in the wafer loading and unloading opening 3. Multiple positioning holes 5 are formed on the bottom of the pod 2.

The batch CVD apparatus 10 of this embodiment includes a main case 11 as one section of the case as shown in FIG. 1, FIG. 2 and FIG. 3.

The front wall 11a of the main case 11 makes up divider walls that separate the outside and inside of the main case 11. A pod loading and unloading opening 12 connecting the inside and outside of the main case 11 is formed midway along the front wall 11a to carry the pod 2 in and out. A front shutter 13 opens and closes the pod loading and unloading opening 12.

A load port 14 is provided on the outer side of the front wall (divider wall) 11a on the main case 11. This load port 14 is positioned directly below the pod loading and unloading opening 12. The load port 14 makes up a loading and unloading port. The load port 14 aligns the placed pod 2 with the pod loading and unloading opening 12. Two load ports 14 are installed in parallel.

An internal process transfer device (also called "in-process transfer device") outside the batch CVD apparatus (outside the case) carries the pod 2 into the load port 14 and also carries the pod 2 out from the load port 14.

A floor drive internal transfer cart 9 (hereinafter, called "AGV") shown in FIG. 1 and a ceiling track overhead hoist transport shown in FIG. 8 (described later on) may be utilized as the inter-process transfer devices and may be both applied to this invention.

A box 14A serving as the front case is installed on the front side of the front wall 11a. This box 14A is formed so as to enclose the load port 14 and the upper space of the load port 14. A ceiling opening 14B is formed on the ceiling wall of the box 14A. A front opening 14C is formed on the front wall of the box 14. In other words, the load port 14 can receive the pod 2 by way of the front opening 14C or can receive the pod 2 by way of the ceiling opening 14B.

The box 14A and the main case 11 together make up the case of the batch CVD apparatus.

A controller 77 described later on, is installed inside the box 14A as shown in FIG. 1.

A pod elevator 15 is installed in the load port 14. The pod elevator 15 is a mechanism for raising and lowering the pod 2 between the pod elevator 15 height and the pod loading and unloading opening 12 height.

The pod elevator 15 contains a elevator drive unit 16, and a shaft 17 raised and lowered by the elevator drive unit 16. A support stand (storage container placement unit) 18 mounted horizontally on the upper end of the shaft 17, and multiple kinematic pins 19 as the storage container positioner means (Also called "the storage container positioner jig") are connected to the pod elevator 15. These kinematic pins 19 are protruded from the upper surface of the support stand 18, and are inserted into the respective positioning holes 5 formed in the bottom side of the pod 2 to position the pod 2 on the support stand 18. The pod elevator 15 supports the pod 2 from the bottom by way of the support stand 18, and raises the pod 2 up and down with the kinematic pins 19 inserted into the positioning holes 5 of the pod 2.

In other words, the support stand 18 is a support unit for holding the bottom of the pod 2 and is also the pod placement unit.

A sealed case 21 making up a load lock chamber 20 is installed on the inner side of the front wall 11a of the main case 11. The sealed case 21 corresponds to the load port 14 height. The load lock chamber 20 makes up a pod lid opening and closing chamber capable of being filled with an inert gas such as nitrogen gas.

One end of a nitrogen gas supply line 21A and one end of an exhaust line 21B are each connected to the sealed case 21 as shown in FIG. 1. The other end of the nitrogen gas supply line 21A connects to a nitrogen gas supply device 21A'. The other end of the exhaust line 21B connects to an exhaust device 21B'. The nitrogen gas supply line 21A supplies nitrogen gas into the load lock chamber 20. The exhaust line 21B exhausts the interior of the load lock chamber 20.

A controller 77 regulates the operation of the nitrogen gas supply device 21A' and the exhaust device 21B'.

A door loading and unloading opening 22 on the front wall 11a of the main case 11, is formed on a section facing the upper side of the load lock chamber 20. This door loading and unloading opening 22 is formed to a size, matching the wafer loading and unloading opening 3 (somewhat larger than wafer loading and unloading opening 3) of the pod 2 placed in the load port 14.

A pod opener 23 is installed as a storage container lid opening and closing unit (Also called "an opening/closing device") inside the load lock chamber 20. This pod opener 23 opens and closes the door loading and unloading opening 22 on the front wall 11a and the wafer loading and unloading opening 3 of the pod 2 placed on the load port 14.

The pod opener 23 includes a moving stand 25 and a closure 26. The moving stand 25 moves forward/rearward (vertically) and up/down (parallel) versus the door loading and unloading opening 22. The closure 26 serving as the lid support unit is moved by the moving stand 25. Along with supporting the door 4, the closure 26 also shuts the door loading and unloading opening 22.

In other words, the moving stand 25 moves the closure 26 that supports the door 4, up/down and forward/rearward, so that the pod opener 23 opens and closes the door loading and unloading opening 22 and the wafer loading and unloading opening 3 of the pod 2.

A mapping device 27 serving as a substrate detector device is installed at a position facing the door loading and unloading opening 22 in the sealed case 21.

This mapping device 27 contains a linear actuator 28 serving as the drive source, a holder 29, and multiple sensors 30. The linear actuator 28 moves the holder 29 forward and rearward versus the wafer loading and unloading opening 3 of the pod 2. The holder 29 supports the multiple sensors 30.

The mapping device 27 detects each wafer 1 within the pod 2 by the individual sensors 30. The mapping device 27 in this way detects whether or not individual wafers 1 are being held in the multiple slots within the pod 2.

A pod storage chamber 11b is formed in the front side area within the main case 11. A swivel pod rack 31 is mounted inside the pod storage chamber 11b. This swivel pod rack 31 is installed in the upper space in approximately the center section facing front and rear in the pod storage chamber 11b. The swivel pod rack 31 is made up of storage racks for storing the storage container within the case.

The swivel pod rack 31 includes multiple rack plates 33 and a support pillar 32. The support pillar 32 is erected perpendicularly and is rotated intermittently within the horizontal plane. Multiple rack plates 33 are affixed at positions on top, mid and bottom levels on the support pillar 32 along the radius. The multiple rack plates 33 can accommodate each of the multiple pods 2.

Multiple kinematic pins 34 are affixed protruding from the upper surface of the rack plate 33. These kinematic pins 34 can insert into the positioning holes 5 on the pod 2.

A pod transfer device 35 is installed within the pod storage chamber 11b. This pod transfer device 35 is made up of a transfer device for transferring the pod 2 between the load port 14 and the swivel pod rack 31 by way of the pod loading and unloading opening 12.

The pod transfer device 35 includes a pod elevator 35a as a storage container elevator mechanism, and pod transfer mechanism 35b as a storage container transfer device. The pod transfer mechanism 35b includes a support unit (Also called "a holding mechanism") for supporting the bottom side of the pod.

The pod transfer device 35 transfers the pod 2 between the support stand 18, swivel pod rack 31, and the placement stand 43 of the pod opener 42 described later by consecutive operation of the pod elevator 35a and the pod transfer mechanism 35b.

As shown in FIG. 2, a sub-case 40 is constructed across the rear end in the lower part of the center section facing frontward/rearward within the main case 11.

A pair of wafer loading and unloading openings 41, 41 are arrayed in two stages, above and below perpendicularly in the front wall 40a of the sub-case 40. Pod openers 42, 42 are each installed in the wafer loading and unloading openings 41, 41 at the above and below stages. The wafers 1 are carried into the sub-case 40 and carried out of the sub-case 40 via the wafer loading and unloading opening 41.

The pod opener 42 contains a placement stand 43 for placing the pod 2, and an attacher/detacher 44 for attaching or detaching the door 4 of the pod 2. By attaching or detaching the door 4 of the pod 2 mounted on the placement stand 43 by the attacher/detacher 44, the pod opener 42 can open or close the wafer loading and unloading opening 3 of the pod 2.

The sub-case 40 includes a prechamber 45. This prechamber 45 is isolated from the storage chamber 11b where the pod transfer device 35 and the swivel pod rack 31 are installed.

A wafer transfer mechanism 46 is installed in the front side area of the prechamber 45. This wafer transfer mechanism 46 includes a wafer transfer device 46a and a wafer transfer device elevator 46b and a tweezers 46c. The tweezers 46c is made up of a placement unit for placing the wafers 1. This wafer transfer device 46a directly advances and swivels the tweezers 46c holding the wafers 1 within a horizontal plane. The wafer transfer device elevator 46b is installed at the right end section in the front area within the prechamber 45. The wafer transfer device elevator 46b raises and lowers the wafer transfer device 46a.

The wafer transfer mechanism 46 transfers the wafers 1 from the pod 2 to the boat (substrate holding jig) 47 and charges these transferred wafers 1 into the boat 47 by consecutively operating the wafer transfer device 46a and the wafer transfer device elevator 46b while holding the wafers 1 in the tweezers 46c.

The wafer transfer mechanism 46 discharges the wafers 1 from the boat 47 by holding in the tweezers 46c, and transfers them from the boat 47 to the pod 2.

The controller 77 regulates the operation of all units within the batch CVD apparatus including the load port 14, the pod elevator 15, the pod opener 23, the mapping device 27, the swivel pod rack 31, the pod transfer device 35, the pod opener 42, and the wafer transfer mechanism 46, etc.

A boat elevator 48 for raising and lowering the boat 47 is installed in the rear side area of the prechamber 45.

A seal cap 50 is installed horizontally on an arm 49 which is a link piece connecting to the elevator stand of the boat elevator 48. This seal cap 50 supports the boat 47 perpendicularly and can seal the bottom end of a processing furnace 51 described later.

The boat 47 contains multiple pieces of support members. The boat 47 supports each wafer 1 horizontally while multiple pieces (for example approximately 50 to 125 wafers) of wafers 1 arrayed perpendicularly.

Though omitted from the drawings for the sake of simplicity, a clean gas supply unit (hereinafter called "clean unit") is installed in the left side end section of the prechamber 45 which is the side opposite the boat elevator 48 side and the wafer transfer device elevator 46b side. This clean unit includes a supply fan and a dust-preventive filter. The clean unit supplies a purified atmosphere or clean air (clean gas) which is inert gas.

A notch aligner device is installed between the wafer transfer device 46a and the clean unit. The notch aligner device is a substrate aligner device for aligning the wafer's circumferential position.

The clean air blown out from the clean unit, passes through the notch aligner device, the wafer transfer device 46a and the boat 47, and is then suctioned via ducts not shown in the drawing. The clean air that was suctioned into the ducts is exhausted outside the main case 11 or is recirculated to the primary side (supply side) which is the suction side of the cleaning unit and blown into the prechamber 45 again by the clean unit.

Figure 4:
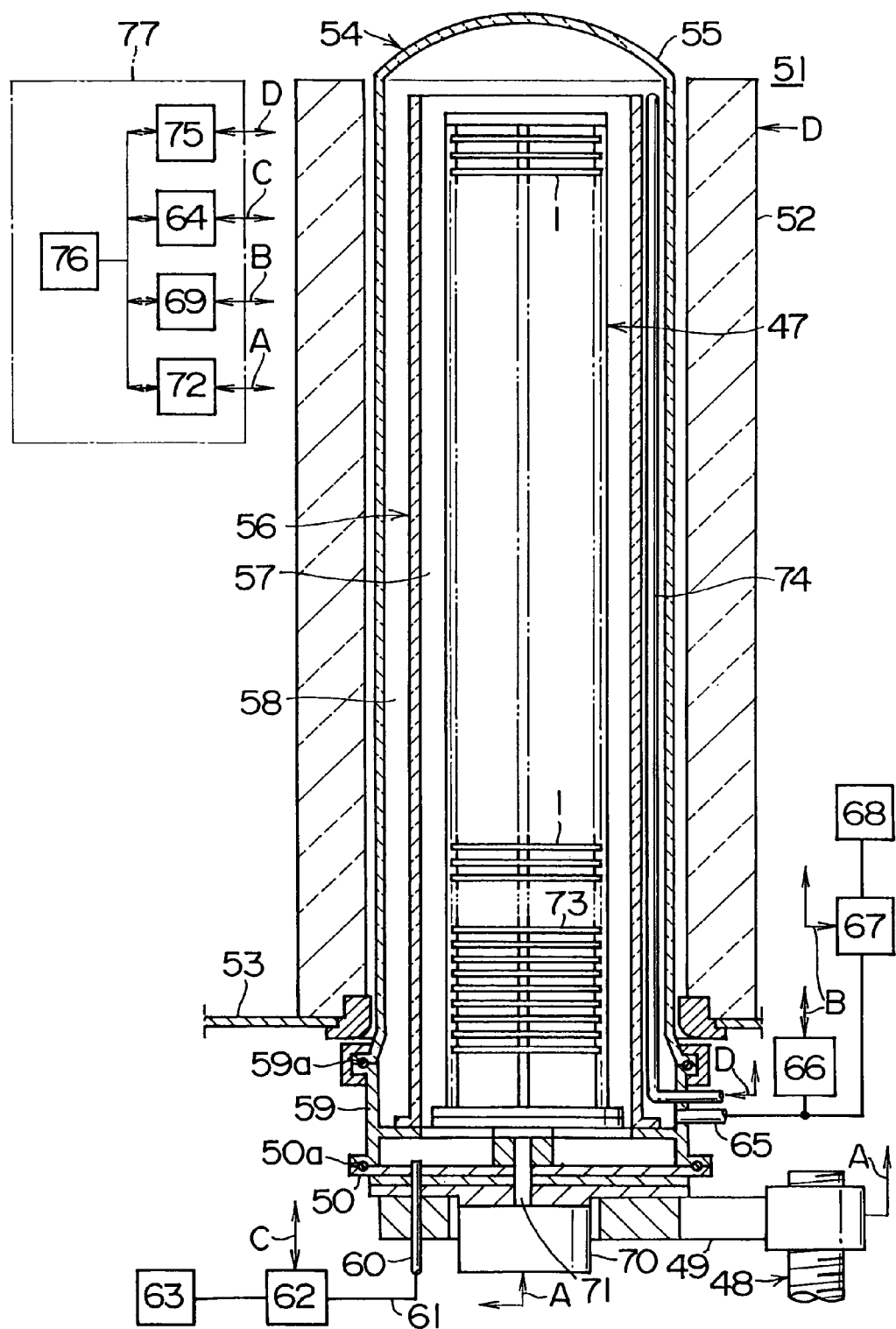
FIG. 4 is a vertical cross sectional view showing the reaction furnace.

The processing furnace 51 shown in FIG. 4 is installed on the sub-case 40.

As shown in FIG. 4, the processing furnace 51 contains a heater 52 as the heating mechanism.

This heater 52 is a cylindrical shape, and is installed perpendicularly supported by a heater base 53 as the support plate.

A process tube 54 serving as the reaction tube is installed concentrically with the heater 52, in the inner side of that heater 52. This process tube 54 includes an outer tube 55 as the external reaction tube, and an inner tube 56 as the internal reaction tube installed on the inner side of the outer tube 55.

The outer tube 55 is formed from a heat-resistant material such as quartz ($SiO_2$) or silicon carbide (SiC). The outer tube 55 has a inner diameter larger than the outer diameter of the inner tube 56, and is formed in a cylindrical shape with the top end sealed and the bottom end open. This outer tube 55 is formed concentrically with the inner tube 56.

The inner tube 56 is formed from a heat-resistant material such as quartz or silicon carbide. The inner tube is formed in a cylindrical shape open at the bottom end and the top end. The hollow space inside the inner tube 56 forms a processing chamber 57. The processing chamber 57 is capable of storing the boat 47 while holding the wafers 1 horizontally and aligned in multiple stages vertically.

The gap between the outer tube 55 and the inner tube 56 forms a tubular space 58.

A manifold 59 installed concentrically with the outer tube 55 is installed below the outer tube 55. The manifold 59 may for example be formed from stainless steel. This manifold 59 is formed in a cylindrical shape open at the top end and the bottom end. This manifold 59 supports the outer tube 55 and the inner tube 56.

The heater base 53 supports the manifold 59, and the process tube 54 is installed in a perpendicular state.

The process tube 54 and the manifold 59 form a reaction container.

An O-ring 59a is installed between the manifold 59 and the outer tube 55 as a sealing member.

A nozzle 60 connects to the seal cap 50 as a gas supply unit. This nozzle 60 connects to the interior of the processing chamber 57. A gas supply pipe 61 connects to this nozzle 60.

A gas supply source 63 connects via a MFC (mass flow controller) 62 to the side (upstream side) opposite the side connecting to the nozzle 60 on the gas supply pipe 61. The MFC 62 is a gas flow rate control device. The gas supply source 63 supplies a desired gas such as process gas or inert gas.

A gas flow rate control unit 64 is electrically connected to the MFC 62 by an electrical wire C. This gas flow rate control unit 64 controls the MFC 62 at the desired specified timing so that the gas is supplied at the desired specified flow rate.

An exhaust pipe 65 is installed on the manifold 59 for evacuating the atmosphere within the processing chamber 57. The exhaust pipe 65 is installed on the bottom end of the tubular space 58, and connects to this tubular space 58.

An exhaust device 68 is connected to the exhaust pipe 65 by way of a pressure sensor 66 and a pressure regulator device 67 on the side (downstream side) opposite the side connecting to the manifold 59. The pressure sensor 66 is a pressure sensor device. The exhaust device 68 includes a vacuum pump, etc. This pressure sensor 66, pressure regulator device 67, and exhaust device 68 exhaust the processing chamber 57 so that the pressure within the processing chamber 57 becomes a specified pressure (vacuum intensity).

A pressure regulator unit 69 electrically connects by way of an electrical wire B to the pressure sensor 66 and the pressure regulator device 67. The pressure regulator unit 69 controls the pressure regulator device 67 at a specified timing so that the pressure within the processing chamber 57 reaches a specified pressure based on the pressure detected by the pressure sensor 66.

The seal cap 50 directly contacts the bottom end of the manifold 59 from the lower side perpendicularly. This seal cap 50 is made up of a furnace opening lid capable of sealing the lower end opening on the manifold 59.

The seal cap 50 is for example made from a metal such as stainless steel and is formed in a disk shape. An O-ring 50a is installed as a sealing member on the upper surface of the seal cap 50. This O-ring 50a directly contacts the bottom end of the manifold 59.

A swivel mechanism 70 to make the boat rotate is installed on the seal cap 50 on the side opposite the processing chamber 57. A rotating shaft 71 of the swivel mechanism 70 passes through the seal cap 50, and connects to the boat 47. The rotating shaft 71 makes the boat 47 rotate to rotate the wafers 1.

A drive control unit 72 electrically connects by way of an electrical wire A to the swivel mechanism 70 and the boat elevator 48. The drive control unit 72 controls the swivel mechanism 70 and the boat elevator 48 to perform the specified desired operation at the specified desired timing.

The boat 47 is formed of a heat resistant material such as quartz or silicon carbide. The boat 47 supports multiple wafers 1 in a horizontal state while the wafers arrayed in multiple stages.

Multiple heat-insulating plates 73 are positioned in a horizontal state and in multiple stages at the lower part of the boat 47. These heat-insulating plates 73 are formed of a heat resistant material such as quartz or silicon carbide, and are formed in a disk shape. The heat-insulating plates 73 are a heat-insulating member. These multiple heat-insulating plates 73 do not easily propagate heat from the heater 52 to the manifold 59 side.

A temperature sensor 74 is installed inside the process tube 54. This temperature sensor 74 is a temperature sensing device. A temperature regulator unit 75 electrically connects by way of an electrical wire D to the temperature sensor 74 and the heater 52.

The temperature regulator unit 75 regulates the electrical power supplied to the heater 52 based on temperature information detected by the temperature sensors 74, to regulate the heater 52 at a specified timing in order to make the temperature within the processing chamber 57 reach a desired temperature distribution.

The gas flow rate control unit 64, pressure regulator unit 69, drive regulator unit 72, and the temperature regulator unit 75 together make up the operating units and the input units. These units are all electrically connected to the main control unit 76 that regulates the operation of the entire batch CVD apparatus.

The controller 77 includes the gas flow rate control unit 64, pressure regulator unit 69, drive regulator unit 72, the temperature regulator unit 75 and the main control unit 76.

The film-forming processing in the IC manufacturing method of an embodiment of the present invention when using the above described batch CVD apparatus is described next.

In the following description, the controller 77 regulates the operation of each unit making up the batch CVD apparatus.

As shown in FIG. 1 through FIG. 3, the pod 2 is placed on the support stand 18 when the pod 2 is carried by the in-process transfer device into the load port 14 by way of the front opening 14c or the ceiling opening 14b.

The pod 2 is positioned on the support stand 18 at this time, by the kinematic pins 19 of the support stand 18 that are inserted in the positioning holes 5 at the bottom the of the pod 2.

Next, as shown in FIG. 5A, the pod 2 is moved towards the pod opener 23 in the load port 14, and the closure 26 of the pod opener 23 supports the door 4.

When the closure 26 supports the door 4, the moving stand 25 retracts, which removes the door 4 from the wafer loading and unloading opening 3.

Then, as shown in FIG. 5B, the lowering of the moving stand 25 within the load lock chamber 20 causes the closure 26 to retract from the wafer loading and unloading opening 3.

As shown in FIG. 5B, when the wafer loading and unloading opening 3 opens, the linear actuator 28 inserts the holder 29 of the mapping device 27 into the wafer loading and unloading opening 3. The sensor 30 of the mapping device 27 commences mapping of the wafers 1 inside the pod 2.

After the specified mapping is completed, the linear actuator 28 returns the holder 29 of the mapping device 27 from the wafer loading and unloading opening 3 to the original standby position.

When the holder 29 returns to standby position, the rising of the moving stand 25 moves the closure 26 to the wafer loading and unloading opening 3.

Then as shown in FIG. 5A, the moving stand 25 advances, to make the closure 26 install the door 4 on the wafer loading and unloading opening 3.

If there is a conflict between the mapping information readout by this mapping device 27, and the mapping information already provided for the applicable pod (pod that was readout) 2, then the pod 2 where the difference was discovered is promptly transported from the load port 14, by the in-process transfer device such as the AGV 9 shown in FIG. 1 to the previous process or to the wafer array process.

Sending the pod 2 immediately back from the load port 14, when the mapping information read by the mapping device 27 is discovered to be different from the pre-provided mapping information drastically cuts down on the number of steps compared to the case when sending the pod 2 back by returning the pod 2 to the loading and unloading port after loading it in particular into the swivel pod rack 31 or the placement stand 43 inside the main case 11. Immediately sending back the pod 2 therefore prevents having to increase the time needed for placing wafers into the boat 47 and having to increase the standby time prior to starting wafer processing.

Figure 6:
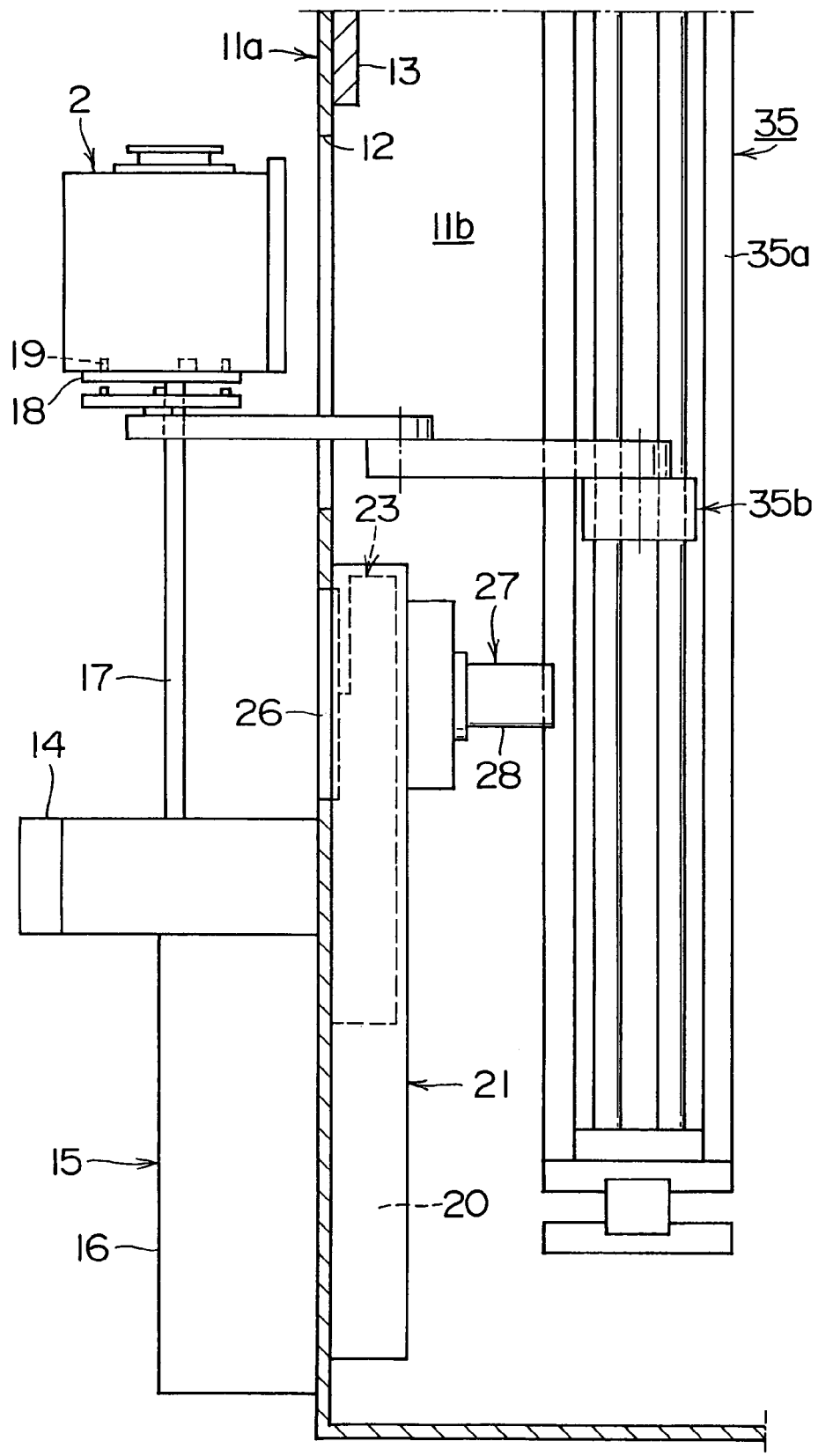

When the mapping information read by the mapping device 27 matches the mapping information already provided for the pod 2, then as shown in FIG. 6, the pod elevator 15 raises the pod 2 supported on the support stand 18, from the load port 14 to the height of the pod loading and unloading opening 12.

More specifically, the pod elevator 15 raises the support stand 18 above the sealed case 21 to a height where the pod transfer mechanism 35b can scoop up the pod 2 from the lower side.

When the pod 2 is raised to the height of the pod loading and unloading opening 12, the front shutter 13 opens the pod loading and unloading opening 12.

The pod transfer mechanism 35b of the pod transfer device 35 next passes through the pod loading and unloading opening 12 and as shown in FIG. 6, scoops up the pod 2 supported on the support stand 18. The pod 2 is in other words transferred between the support stand 18 and the pod transfer mechanism.

The pod 2 scooped up by the pod transfer mechanism 35b is carried from the pod loading and unloading opening 12 into the main case 11. In other words, the pod transfer mechanism carries the pod 2 from outside the main case 11 via a space above the pod opener 23 and sealed case 21 to inside the main case 11. Another way of expressing this action is that the pod 2 is carried from the outside, over the sealed case 21 and pod opener 23 into the main case 11.

As shown in FIG. 1 and FIG. 2, the pod transfer device 35 automatically transfers and delivers the pod 2 to the designated rack plate 33 of the swivel pod rack 31.

The pod 2 at this time is positioned and held on the rack plate 33 by the kinematic pins 34 of the rack plate 33 that are inserted into the positioning holes 5 on the bottom of the pod 2.

The pod 2 is then temporarily stored on the rack plate 33.

The pod transfer device 35 then transfers the pod 2 from the rack plate 33 to one of the pod openers 42 and places the pod 2 on the placement stand 43.

The wafer loading and unloading opening 41 of the pod opener 42 is at this time closed by the attacher/detacher 44, and clean air flows in to fill the prechamber 45.

Nitrogen gas serving as the clean air is filled into the prechamber 45. The oxygen concentration in the prechamber 45 at this time is for example 20 ppm or less, which is much lower than the oxygen concentration in the interior (air atmosphere) of the main case 11.

After the pod transfer mechanism 35b carries the pod 2 from the pod loading and unloading opening 12 into the main case 11, the pod 2 may also be directly transferred to the pod opener 42 installed in the wafer loading and unloading opening 41.

The open side end surface of the pod 2 placed on the placement stand 43 is then pressed against the open side edge of the wafer loading and unloading opening 41 on the front wall 40a. The attacher/detacher 44 then detaches the door 4, and the wafer loading and unloading opening 3 of the pod 2 is opened.

In this case, mapping has already been completed in the load port 14 so that the mapping of the wafer 1 group in the pod 2 can be omitted.

When the pod opener 42 opens the pod 2, the wafer transfer device 46a picks up the wafers 1 with the tweezers 46c from the pod 2 by way of the wafer loading and unloading opening 3. When the tweezers 46c pick up the wafers 1, the wafer transfer device 46a transfers the wafers 1 to the notch aligner device (not shown in drawing). This notch aligner device aligns the wafer 1 position. After alignment, the wafer transfer device 46a picks up the wafers 1 from the notch aligner device with the tweezers 46c and transfers them to the boat 47. The wafer transfer device 46a charges the wafers 1 into the boat 47.

The wafer transfer device 46a that delivered the wafers 1 into the boat 47, returns to the pod 2, and charges the next wafers 1 into the boat 47.

While the wafer transfer mechanism 46 is charging the wafers 1 into the boat 47 in one (top stage or bottom stage) of the pod openers 42, the pod transfer device 35 transfers another pod 2 from the swivel pod rack 31 to the other pod opener 42 (bottom stage or top stage). The process of opening the pod 2 by the pod opener 42 proceeds simultaneously on the other pod opener 42.

The lower end of the processing furnace 51 that was closed by the furnace shutter (not shown in drawing) is opened by the furnace shutter when the pre-specified number of wafers 1 is charged into the boat 47.

Next, the boat elevator 48 raises the seal cap 50 to carry the boat 47 holding the wafer 1 group into the processing furnace 51 (Boat loading).

The method for forming the thin film on the wafers 1 using the processing furnace 51 by the CVD method is described next.

In the following description, the controller 77 controls the operation of each unit making up the processing furnace 51.

After multiple wafers 1 have been charged into the boat 47 (Wafer charging), then as shown in FIG. 4, the boat elevator 48 raises the boat 47 holding the multiple wafers 1, to carry the boat into the processing chamber 57 (Boat loading).

While in this state, the seal cap 50 maintains the bottom end of the manifold 59 in a sealed state by way of the O-ring 50a.

The exhaust device 68 exhausts the interior of the processing chamber 57 to reach the specified pressure (vacuum intensity). The pressure sensor 66 at this time measures the pressure inside the processing chamber 57, and then the pressure regulator device 67 is performed feedback control based on the pressure measured by the pressure sensor 66.

The heater 52 heats the interior of the processing chamber 57 to reach the specified temperature. The electrical power applied to the heater 52 is regulated at this time by feedback based on the temperature information that was detected by the temperature sensor 74 in order to attain a specified desired temperature distribution within the processing chamber 57.

The swivel mechanism 70 next rotates the boat 47 to swivel the wafers 1.

Next, the gas supplied from the gas supply source 63 and regulated to a specified flow rate by the MFC 62 is fed into the processing chamber 57 from the nozzle 60 after flowing through the gas supply pipe 61.

The gas fed into the processing chamber 57 rises, and flows from the open upper end of the inner tube 56 into the tubular space 58, and is exhausted from the exhaust pipe 65.

The gas makes contact with the surface of the wafer 1 when passing through the interior of the processing chamber 57. A thin film is at this time deposited by a thermal CVD reaction onto the surface of the wafer 1.

After a pre-specified processing time has elapsed, inert gas is supplied from the gas supply source 63 by way of the gas supply pipe 61, and besides replacing the atmosphere in the processing chamber 57 with the inert gas, the interior of the processing chamber 57 is restored to the ordinary pressure.

The boat elevator 48 then lowers the seal cap 50, the bottom end of the manifold 59 is opened, and the now processed wafers 1 are carried out from the bottom end of the manifold 59 while held in the boat 47, to outside the process tube 54 (Boat unloading).

The wafer transfer device 46a extracts the processed wafers 1 from the boat 47 (Wafer discharging), and returns them in a pre-transferred empty pod 2 to the pod opener 42.

When a specified number of processed wafers 1 have been stored, the pod opener 42 attaches the door 4 onto the wafer loading and unloading opening 3 of the pod 2.

The pod transfer device 35 automatically transfers and delivers the pod 2 closed the wafer loading and unloading opening 3 to the specified rack plate 33 of the swivel pod rack 31.

The pod 2 is temporarily stored. When the front shutter 13 later opens, the pod transfer device 35 transfers the pod 2 from the rack plate 33 to the pod loading and unloading opening 12, and delivers the pod 2 through the pod loading and unloading opening 12 on the support stand 18 of the boat elevator 15.

The pod transfer device 35 may directly transfer the pod 2 holding the processed wafers 1, from the pod opener 42 to the pod loading and unloading opening 12.

The front shutter 13 closes when the pod 2 is delivered to the support stand 18. Also, the elevator drive unit 16 lowers the shaft 17 of the pod elevator 15 onto the load port 14.

An in-process transfer device such as the AGV 9 shown in FIG. 1 transfers the pod 2 that was lowered onto the load port 14 to the specified process.

The embodiment as described above renders the following effects.

1) Installing a mapping device in the load port where the pod is carried in by the in-process transfer device, allows sending the pod directly back from the load port when the actual mapping information read by the mapping device was found not to match the pre-supplied mapping information. Therefore, compared to the method of the prior art where a mapping device is installed in the pod opener within the case, the present invention renders the effect that the delay in starting the wafer processing due to discovering a mismatch in the mapping information can be shortened by an amount equal to the time saved from eliminating the task of returning the pod to the load port after having loaded it in the case.

2) The handling section of the storage container transfer unit requires a lowering/raising function (telescoping function) and a grip function (horizontal telescoping function) when gripping the upper part of the storage container. Providing the handling section of the storage container transfer unit with different functions requires reinforcing the storage container transfer unit itself so that the storage container transfer unit must be enlarged. The structure therefore becomes complicated so that costs and problems tend to increase. The storage containers are often dropped due to failure to grip the container, etc. The above structure also has many disadvantages such as a greater equipment height due to the need to create an overhead gripping space, enlargement of the storage racks to make the handling section larger and long-term of the storage container transfer time due to gripping action.

In contrast, installing a pod loading and unloading opening above the load port, and installing a pod elevator to lower and raise a support stand for holding the pod from below, between the load port and the pod loading and unloading opening to let the pod transfer device to scoop up the pod from the lower side, allows making a simpler and smaller handling structure compared to handling that grips the upper part of the pod. The CVD apparatus can therefore be made smaller, simpler, faster, with better safety and more effective use of space.

3) Installing kinematic pins in the support stand lowered and raised by the pod elevator allows setting the support stand at transfer device reference guides for each pod placement unit. Therefore, the transfer reference standards can be attained.

4) By separating the pod elevator and the pod transfer device, the pod transfer device can be operated right up to the pod delivery position and made to stand by while simultaneously raising and lowering the pod in the load port. In other words, parallel processing operations can be performed simultaneously so that the total transfer time can be shortened.

5) The pod elevator can raise the support stand up to the height where the pod transfer device can scoop up the pod from the lower side so that the pod can be safely delivered compared to the case where handling the upper section of the pod.

6) The wafer in the pod in the load port can be mapped inside the load lock chamber that was purified with inert gas so that contamination and the forming of a natural oxidation film can be prevented.

FIG. 7 is a side cross sectional view showing the batch CVD apparatus as the second embodiment of the present invention.

The main point where this embodiment differs from the previous embodiment is only that a pod opener is installed only in the load port.

Namely as shown in FIG. 7, a load port 14 is installed in the front wall (divider wall) of the sub-case 40 forming the prechamber 45. A pod opener 83 is installed in this front wall 40a. A wafer loading and unloading opening 91 is formed in the rear wall 81a of a sealed case 81 forming a load lock chamber 80 of the pod opener 83. A door mechanism 92 for opening and closing this wafer loading and unloading opening 91 is also installed on the sealed case 81.

A wafer transfer mechanism 46 serving as the substrate transfer device is installed inside the prechamber 45. The wafer transfer mechanism 46 transfers the wafers 1 between the pod 2 and the boat 47 while the door mechanism 92 has opened the wafer loading and unloading opening 91.

The boat elevator 48 carries the boat 47 into the processing chamber 57 of the processing furnace 51 adjacently contacting the prechamber 45, and carries out the boat 47 from the processing chamber 51.

A storage rack 31A and a pod transfer device 35 are installed in the storage chamber 11b adjacently contacting the ceiling surface of the prechamber 45.

The pod loading and unloading opening 12 is formed in a section facing the storage chamber 11b on the front wall 11a of the main case 11. The front shutter 13 opens and closes the pod loading and unloading opening 12.

A mapping device 84 is installed in the load lock chamber 80 the same as the pod opener 42 of the first embodiment. The mapping device 84 can move forward and rearward (perpendicularly) and upward and downward (parallel) to the door loading and unloading opening 82.

The effect of the pod opener in the above structure is described next.

The controller 77 controls the following operations.

As shown in FIG. 7, the pod 2 is mounted on the support stand 18 of the pod elevator 15, when the in-process transfer device carries the pod 2 into the load port 14 by way of the front opening 14C or the ceiling opening 14B.

The pod 2 is at that time positioned on the support stand 18 by the insertion of the kinematic pins 19 affixed to the support stand 18, into the positioning holes 5 on the lower surface of the pod 2.

Next, the pod 2 is moved towards the pod opener 83 in the load port 14, and the closure 86 of the pod opener 83 holds the door 4.

When the door 4 is held, the closure 86 removes the door 4 from the wafer loading and unloading opening 3 and the door loading and unloading opening 82 by retracting the moving stand 85. The moving stand 85 then lowers the closure 86 within the load lock chamber 80, and the closure 86 then moves away from the positions of the wafer loading and unloading opening 3 and the door loading and unloading opening 82.

When the wafer loading and unloading opening 3 is opened, the sensor of the mapping device 84 is inserted into the wafer loading and unloading opening 3 (See FIG. 5B). The sensor of the mapping device 84 then maps the wafers 1 within the pod 2.

When the specified mapping is finished, the mapping device 84 removes the sensor from the wafer loading and unloading opening 3 and restores it to the original standby position.

The closure 86 is then moved to the wafer loading and unloading opening 3 position along with the rise of the moving stand 85. The forward movement of the moving stand 85 then makes the closure 86 attach the door 4 to the wafer loading and unloading opening 3 and the door loading and unloading opening 82.

When the actual mapping information readout by this mapping device does not match the pre-supplied mapping information on the applicable pod 2, the pod 2 where the difference was discovered, is promptly transferred back by for example, the in-process transfer device such as the AGV 9 shown in FIG. 1 to the wafer array process or the directly prior process from the load port 14.

When the actual mapping information readout by the above described mapping device does match the pre-supplied mapping information on the applicable pod 2, the pod elevator 15 raises the pod 2 supported on the support stand 18 from the load port 14 to the pod loading and unloading opening 12 height.

When the pod 2 rises to the pod loading and unloading opening 12 height, the front shutter 13 opens the pod loading and unloading opening 12.

Next, the pod transfer mechanism 35b of the pod transfer device 35 scoops up the pod 2 that is supported by the support stand 18.

The pod transfer mechanism 35b carries this scooped up pod 2 from the pod loading and unloading opening 12 into the main case 11.

The pod transfer device 35 transfers this pod 2 into the storage rack 31A, and automatically delivers it to the specified rack plate 33A.

This pod 2 is then temporarily stored in the rack plate 33.

Then in the reverse of the above procedure, the pod transfer device 35 and the pod elevator 15 transfer the pod 2 from the storage rack 31A to the load port 14.

At this time, clean air flows in to fill the prechamber 45.

Next, in the load port 14, the pod 2 is moved towards the pod opener 83. The closure 86 of the pod opener 83 holds the door 4.

While this door 4 is held, the closure 86 removes the door 4 from the wafer loading and unloading opening 3 by retracting the moving stand 85. The moving stand 85 then lowers the closure 86 within the load lock chamber 80, and the closure 86 separates from the wafer loading and unloading opening 3 and the door loading and unloading opening 82 position.

When the wafer loading and unloading opening 3 opens, the door mechanism 92 opens the wafer loading and unloading opening 91.

The mapping of the wafers within the pod has already been finished at this time, and so can be omitted here.

When the wafer loading and unloading opening 3 and the wafer loading and unloading opening 91 are opened, the wafer transfer device 46a utilizes the tweezers 46c to pick up the wafers 1 from the pod 2 through the wafer loading and unloading opening 3, the wafer loading and unloading opening 91 and the door loading and unloading opening 82. The wafer transfer device 46a transfers these picked up wafers 1 to the notch aligner device. This notch aligner device aligns the wafers 1. After notch alignment, the wafer transfer device 46a uses the tweezers 46c to pick up the wafers 1 from the notch aligner device. The wafer transfer device 46a transfers the picked up wafers 1 to the boat 47, and charges them into the boat 47.

The wafer transfer device 46a that delivered the wafers 1 to the boat 47, returns to the pod 2, and then charges the next wafers 1 into the boat 47.

The wafer transfer device 46a may also directly transfer the wafers 1 with the tweezers 46c from the pod 2 without performing the step of storing the pod 2 temporarily in the storage rack 31A. In other words, the wafer loading and unloading opening 91 is opened when mapping is in progress, or is finished and the mapping device sensor returns from the wafer loading and unloading opening 3 to the original standby position. The wafer transfer device 46a inserted the tweezers 46c into the wafer loading and unloading opening 91, and picks up the wafers 1 from the pod 2.

The subsequent steps are the same as the previous embodiment so a description is omitted.

In this embodiment, the pod opener can be installed in the load port which helps use space more efficiently (footprint is reduced) and improves the throughput (pod movement envelope can be reduced).

Figure 8:
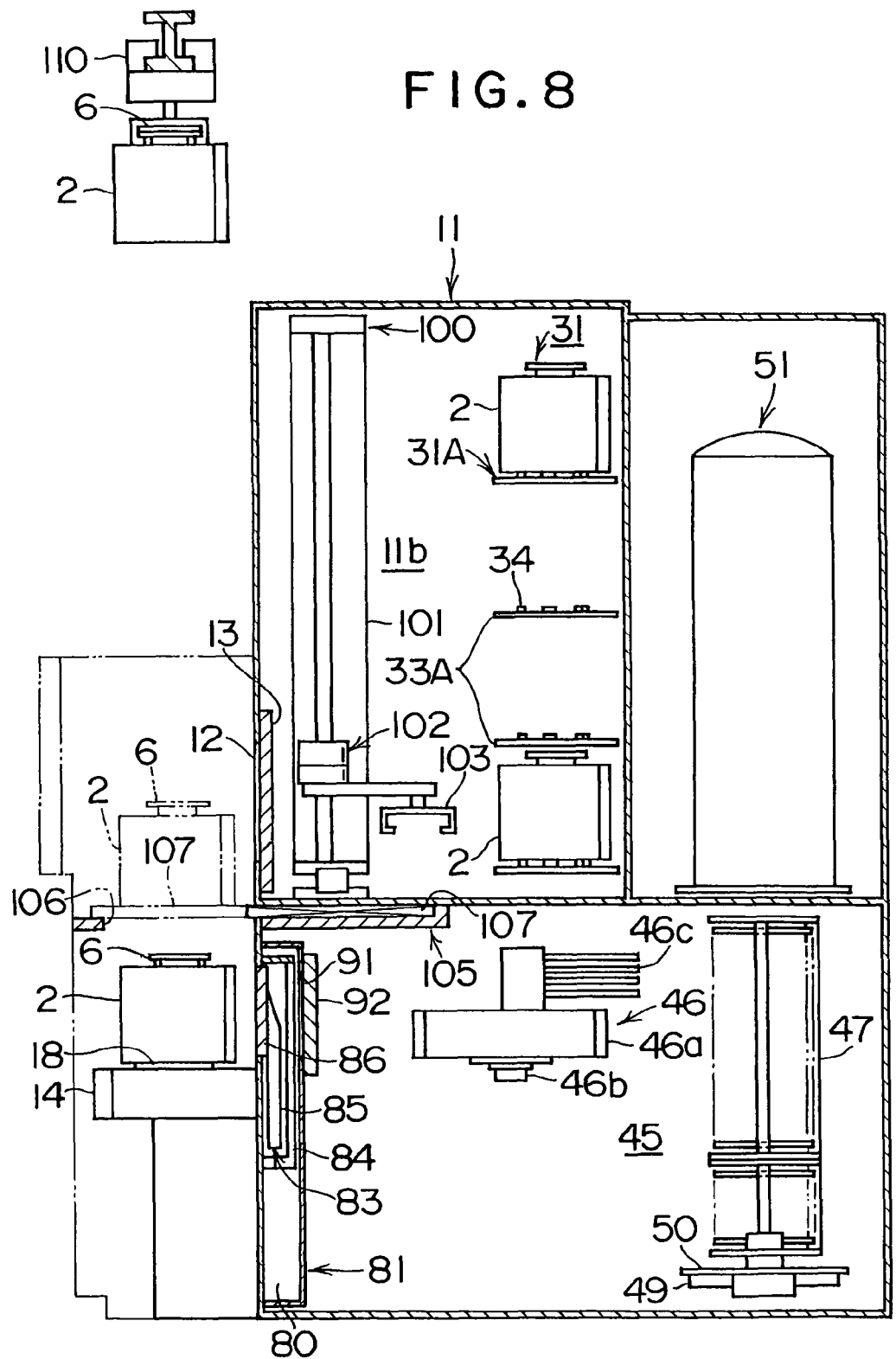
FIG. 8 is a side cross sectional view showing the batch CVD apparatus as the third embodiment of the present invention.

FIG. 8 is a side cross sectional view showing the batch CVD apparatus of the third embodiment of the present invention.

This embodiment differs from the second embodiment in the point that the structure performs handling by gripping the upper section of the pod; and in the point that a pod stage mechanism capable of accepting the pod from a ceiling track overhead hoist transport (hereinafter called "OHT") even while transferring the wafer within the pod is provided.

In other words, as shown in FIG. 8, a pod transfer device (hereinafter called "grip-type pod transfer device") 100 for handling by gripping the upper section of the pod is installed along with the storage rack 31A in the storage chamber 11b adjoining the ceiling surface of the prechamber 45.

This grip-type pod transfer device 100 includes a pod elevator 101, and a pod transfer mechanism 102 raised and lowered by the pod elevator 101, and a grip unit 103 moved by the pod transfer mechanism 102. The grip unit 103 can extend or contract to grip from above the brim 6 affixed to the upper surface of the pod 2.

The pod stage mechanism 105 contains a slide plate 107 for opening and closing an opening section 106 formed directly above the load port 14. While the opening section 106 is open, the pod stage mechanism 105 places the pod 2 from the OHT 110 on the support stand 18 of the load port 14 by way of the opening slot 14B and the opening section 106.

On the other hand, when the slide plate 107 has closed the opening section 106, the OHT 110 places the pod 2 on the slide plate 107 (temporarily functions as a storage rack).

Then in placement of the pods 2 from the slide plate 107 onto the support stand 18 of the load port 14, the pod stage mechanism 105 slides the slide plate 107 to open the opening section 106 with the pod transfer mechanism 102 holding up the pod 2. The pod transfer mechanism 102 next handles the pod 2, and by way of the opening section 106, places the pod 2 onto the support stand 18 of the load port 14.

The pod handling step by the pod stage mechanism 105 and the grip-type pod transfer device 100 related above is described next.

The other steps such as the wafer mapping step within the pod are the same as in the previously described second embodiment. A description of these steps is omitted.

The OHT 110 directly supplies the pod 2 onto the load port 14 by way of the ceiling opening 14B and the opening section 106 as shown in FIG. 8.

The kinematic pins 19 of the support stand 18 are at this time inserted into the positioning holes 5 on the lower side of the pod 2 in order to position the pod 2 on the support stand 18.

In the load port 14, the mapping device maps the wafers within the pod (See the first embodiment and the second embodiment).

In this mapping step, when the actual mapping information read out by the mapping device does not match the pre-supplied mapping information on the applicable pod 2, the pod 2 whose information is a mismatch is promptly sent back by the OHT 110 from the load port 14 to the previous process or to the wafer array process.

When the actual mapping information read-out by the mapping device does match the pre-supplied mapping information on the applicable pod 2, the front shutter 13 opens the pod loading and unloading opening 12, and the pod elevator 101 lowers the pod transfer mechanism 102 to a position facing the pod loading and unloading opening 12.

Next, the pod transfer mechanism 102 makes the grip unit 103 pass through the pod loading and unloading opening 12, moving it directly above the pod 2.

The pod transfer mechanism 102 next lowers the grip unit 103. The grip unit 103 extends downward and grips the brim 6 of the pod 2 from the upper section.

When the brim 6 of the pod 2 is gripped, the grip unit 103 contracts upward and besides hoisting the pod 2 upward, the pod elevator 101 raises the pod transfer mechanism 102 to a height matching the pod loading and unloading opening 12.

The pod transfer mechanism 102 carries the hoisted pod 2 from the pod loading and unloading opening 12 into the pod storage chamber 11b of the main case 11.

The grip-type pod transfer device 100 transfers the pod 2 to the storage rack 31A and, automatically delivers it to the specified rack plate 33A.

The pod 2 is then temporarily stored.

In the reverse of the above procedure, the grip-type pod transfer device 100 transfers the pod 2 from the storage rack 31A to the load port 14.

When the OHT 110 for example has carried in another pod 2 during the mapping step, the pod stage mechanism 105 accepts the applicable pod 2 from the OHT 110 by way of the slide plate 107, and the pod 2 is temporarily stored in the slide plate 107.

In other words, as shown by the phantom line in FIG. 8, the pod stage mechanism 105 slides the slide plate 107 to close the opening section 106 so that the slide plate 107 accepts the pod 2 from the OHT 110. Restated, the slide plate 107 fulfils the function of a temporary storage rack.

When then shifting the pod 2 from the slide plate 107 to the support stand 18 of the load port 14, in a state where the pod transfer mechanism 102 has raised the pod 2 from the slide plate 107, the pod stage mechanism 105 slides the slide plate 107 to open the opening section 106. The pod transfer mechanism 102 then places the raised pod 2 onto the support stand 18 of the load port 14 by way of the opening section 106.

In addition to the effects of the second embodiment, the present embodiment also renders the following effect.

When the OHT had transferred a pod during the mapping step, the pod stage mechanism can accept that pod from the OHT by way of the slide plate and temporarily store the pod.

FIG. 9 is a side cross sectional view showing the batch CVD apparatus of the fourth embodiment of the present invention.

The point where the present embodiment differs from the first embodiment is that, the present embodiment includes a pod transfer device (hereinafter, called "grip-type pod transfer device") 200 for transferring gripping the brim 6 of the pod 2.

In other words, the grip-type pod transfer device 200 as shown in FIG. 9, is installed in the pod storage chamber 11*b*. This grip-type pod transfer device 200 can transfer the pod 2 between the support stand 18 and the interior of the pod storage chamber 11*b*, via the pod loading and unloading opening 12 while gripping the brim 6.

This grip-type pod transfer device 200 includes a pod elevator 201, a pod transfer mechanism 202 lowered and raised by the pod elevator 201, and a grip unit 203 moved by the pod transfer mechanism 202. This grip unit 203 contains a grip-type that extends and contracts horizontally to grip the brim 6; and a type formed with a concavity to hook on the brim section and containing no horizontal telescoping/contracting mechanism, and a type containing a mechanism that extends and contracts perpendicularly.

A controller 77 controls this grip-type pod transfer device 200.

A few of methods for operating the grip-type pod transfer device configured as related above are described next.

In the following description, the controller 77 controls the operation of the grip-type pod transfer device 200, the pod elevator 15, and the front shutter, 13, etc.

The first example of an operating method is shown in FIG. 10A through FIG. 10D.

As shown in FIG. 10A, the pod elevator 15 extends the shaft 17 by way of the elevator drive unit 16, and raises the support stand 18 supporting the pod 2 so that the lower edge of the pod 2 reaches a position higher than the reference height 204. Simultaneous with operation of the pod elevator 15, the pod elevator 201 raises the pod transfer mechanism 202 and the grip unit 203 so that the height of the grip unit 203 reaches the same height as the brim 6.

The reference height 204 is the height of the lower end of the pod loading and unloading opening 12 (See FIG. 9) and is a position whose height is at least higher than the upper edge of the sealed case 21. This position is higher than the upper edge of the load lock chamber 20.

The front shutter 13 opens the pod loading and unloading opening 12 (See FIG. 9).

As shown in FIG. 10B, the pod transfer mechanism 202 extends and by moving horizontally to the grip unit 203 outside the main case 11 by way of the pod loading and unloading opening 12 from inside the pod storage chamber 11*b*, places the grip unit 203 below the brim 6.

As then shown in FIG. 10C, when the pod elevator 201 raises the pod transfer mechanism 202, the grip unit 203 hoists the pod 2 from above the support stand 18.

As next shown in FIG. 10D, the grip-type pod transfer device 200 contracts the pod transfer mechanism 202, and carries the pod 2 into the pod storage chamber 11*b*.

On the other hand, the pod elevator 15 contracts the shaft 17 by the elevator drive unit 16, and lowers the support stand 18 to the load port 14.

The grip-type pod transfer device 200 then transfers the pod 2 to the swivel pod rack 31, delivering it to the specified rack plate 33.

The first example merely consists of the grip unit 203 hooking onto the brim 6. The grip unit 203 therefore does not require a structure that extends or contracts perpendicularly or horizontally, so the structure and the operation are simple. Consequently, the cost is low, the structure saves space, and the operating time is shortened.

A second example of an operating method is shown in FIG. 11A through FIG. 11D.

The pod elevator 15 as shown in FIG. 11A, extends the shaft 17 by the elevator drive unit 16, and raises the support stand 18 supporting the pod 2 so that the lower edge of the pod 2 reaches a position lower than the reference height 204 and the brim 6 reaches a position higher than the reference height 204.

Simultaneous with operation of the pod elevator 15, the pod elevator 201 raises or lowers the pod transfer mechanism 202 and the grip unit 203 so that the height of the grip unit 203 reaches the same height as the brim 6.

The front shutter 13 opens the pod loading and unloading opening 12 (See FIG. 9).

As shown in FIG. 11B, the pod transfer mechanism 202 extends and by moving horizontally to the grip unit 203 outside the main case 11 by way of the pod loading and unloading opening 12 from inside the pod storage chamber 11*b*, places the grip unit 203 below the brim 6.

As then shown in FIG. 11C, when the pod elevator 201 raises the pod transfer mechanism 202, the grip unit 203 hoists the pod 2 from above the support stand 18.

As next shown in FIG. 11D, the grip-type pod transfer device 200 contracts the pod transfer mechanism 202, and carries the pod 2 into the pod storage chamber 11*b*.

The pod elevator 15 on the other hand, contracts the shaft 17 by the elevator drive unit 16, and lowers the support stand 18 to the load port 14.

The grip-type pod transfer device 200 then transfers the pod 2 to the swivel pod rack 31, delivering it to the specified rack plate 33.

Compared to the first example, even though this example is inferior in terms of operation time and the operation required for the pod elevator 201 to raise or lower the pod 2 between the heights of the pod loading and unloading opening 12 and the support stand 18, the structure of the second example is only a grip unit 203 catching on the brim 6. The grip unit 203 therefore does not require a mechanism that extends or contracts horizontally or vertically, so that the structure and the operation are simple. The cost is therefore low, the structure saves space, and the operating time is shortened.

A third example of an operating method is shown in FIG. 12A through FIG. 12D and FIG. 13A and FIG. 13B.

The pod elevator 15 as shown in FIG. 12A, extends the shaft 17 by the elevator drive unit 16, and raises the support stand 18 supporting the pod 2 so that the brim 6 reaches a position directly below the reference height 204. Simultaneous with operation of the pod elevator 15, the pod elevator 201 raises or lowers the pod transfer mechanism 202 and the grip unit 203 so that the grip unit 203 is at a height facing the pod loading and unloading opening 12.

The front shutter 13 opens the pod loading and unloading opening 12 (See FIG. 9).

As shown in FIG. 12B, the pod transfer mechanism 202 enters the pod loading and unloading opening 12, and the grip unit 203 is positioned directly above the brim 6.

As next shown in FIG. 12C, the when the pod elevator 201 lowers the pod transfer mechanism 202, the grip unit 203 lowers to the brim 6. The grip unit 203 then extends horizontally.

As next shown in FIG. 12D, the grip unit 203 contracts horizontally, and is positioned below the brim 6.

Then, as shown in FIG. 13A, when the pod elevator 201 raises the pod transfer mechanism 202, the grip unit 203 hoists the pod 2 on the support stand 18. The pod elevator 201 raises the pod transfer mechanism 202 at least to a height where the bottom side of the pod 2 is above the reference height.

As shown in FIG. 13B, the grip-type pod transfer device 200 contracts the pod transfer mechanism 202, and carries the pod 2 into the pod storage chamber 11*b*.

The pod elevator 15 on the other hand, contracts the shaft 17 by the elevator drive unit 16, and lowers the support stand 18 to the load port 14.

The grip-type pod transfer device 200 then transfers the pod 2 to the swivel pod rack 31, delivering it to the specified rack plate 33.

Though compared to the first example and the second example, this third example is inferior in terms of the operation time and the operation required for the pod elevator 201 to raise or lower the pod 2 between the support stand 18 height and the pod loading and unloading opening 12 height, and in that the grip unit 203 needs a mechanism to extend or contract horizontally; this grip unit 203 does not require a mechanism to extend or contract vertically so that the structure and operation is simple. The cost is therefore low, the structure saves space, and the operating time is shortened.

The structure in the fourth embodiment includes a grip-type pod transfer device and a pod elevator in the load port so that when raising or lowering the support stand on the load pod, the grip-type pod transfer device can perform other operations such as transferring other pods to the swivel pod rack or to the pod opener of the sub-case. The operating efficiency of the grip-type pod transfer device is therefore improved.

By separating this structure into a pod elevator and a grip-type pod transfer device, the grip-type pod transfer device can be operated up to the pod delivery position and kept in a stand-by condition, simultaneously with raising the pod in the load port. In other words, processes can be performed simultaneously and in parallel which shortens the total transferring time.

The pod delivery time can be also shortened since the pod elevator can be lowered while simultaneously raising the grip-type pod transfer device.

The operating method of the fourth embodiment can be applied to the first embodiment and the second embodiment. The same effects can be obtained in the first and the second embodiments are obtained when this fourth embodiment is applied.

Figure 14:
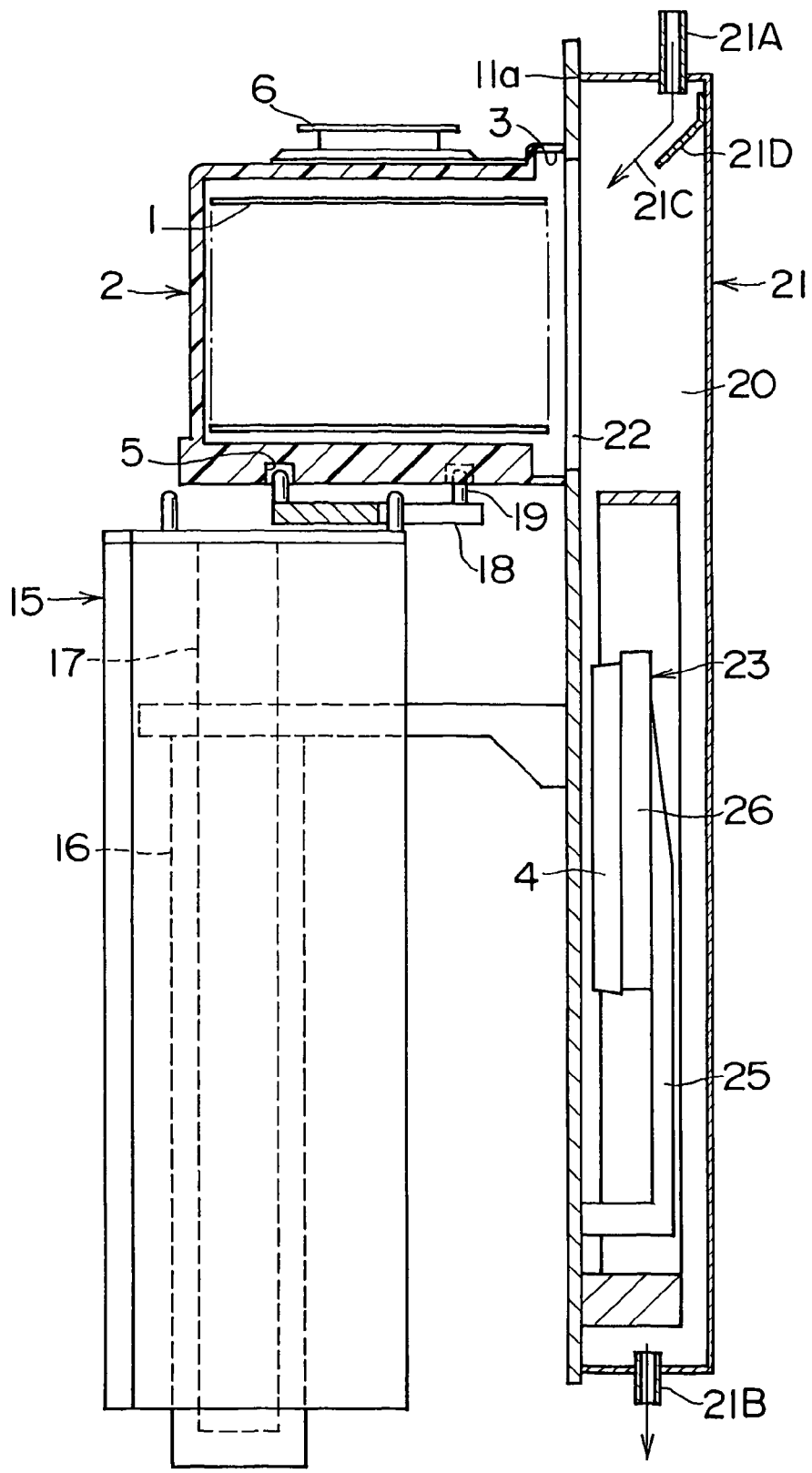
FIG. 14 is a side cross sectional view showing a preferred embodiment of the pod opener.

FIG. 14 is a side cross sectional view showing a preferred embodiment of the pod opener.

Figure 15:
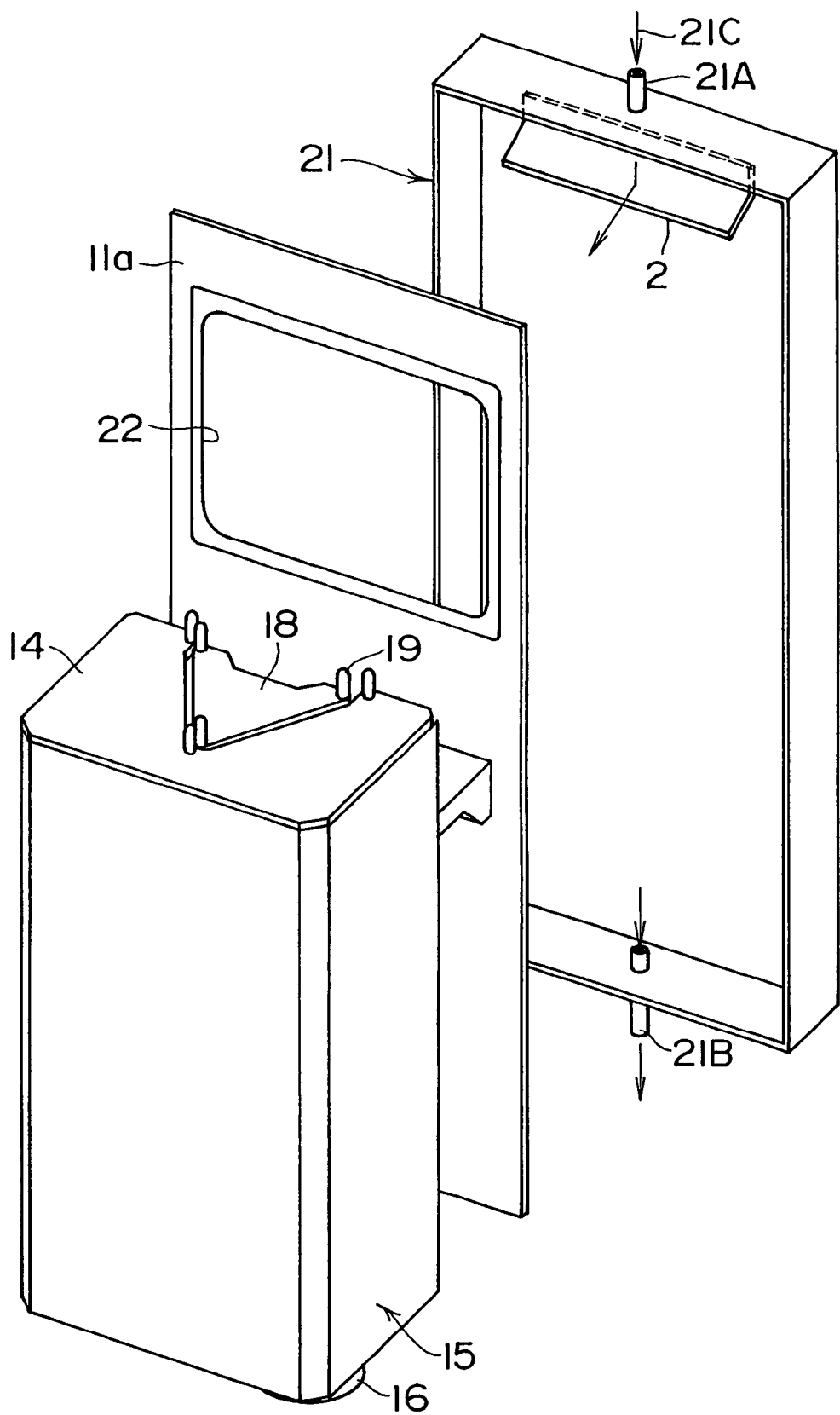
FIG. 15 is a perspective exploded view of that pod opener.

FIG. 15 is a perspective exploded view of that embodiment.

As shown in FIG. 14, one end of a nitrogen gas supply line 21A is connected to the upper wall of the sealed case 21. One end of an exhaust line 21B is connected to the lower wall of the sealed case 21. The nitrogen gas supply line 21A blows the nitrogen gas 21C from a blow vent downward into the load lock chamber 20. The exhaust line 21B exhausts the interior of the load lock chamber 20.

As shown in FIG. 14 and FIG. 15, a louver 21D is installed on the top edge within the load lock chamber 20, at a position opposite the blow vent for the nitrogen gas supply line 21A. This louver 21D is a deflector piece for deflecting the flow of the nitrogen gas 21C blown from the blow vent for the nitrogen gas supply line 21A. The louver 21D is tilted towards the door loading and unloading opening 22. Tilting the louver 21D makes the nitrogen gas flow to the door loading and unloading opening 22.

The function and the effect of the pod opener in the above structure is described next.

The nitrogen gas supply line 21A is connected to the upper end of the load lock chamber 20. The exhaust line 21B is installed at the lower end. Therefore, the nitrogen gas flows downward within the load lock chamber 20. This downward flow of the nitrogen gas 21C is effective in exhausting foreign objects such as dust particles and organic matter within the load lock chamber 20. In other words, the downward flow of the nitrogen gas 21C can in advance prevent foreign objects from entering the pod 2 and attaching to the wafer 1. Foreign objects in the load lock chamber 20 include organic matter and dust particles, etc. from the moving stand 25, the closure 26 and the mapping device 27 installed in the load lock chamber 20.

The louver 21D deflects the nitrogen gas 21C towards the door loading and unloading opening 22, guiding it into the pod 2. The flow of the nitrogen gas 21C into this pod 2 prevents foreign objects from being caught up in the convective flow from the lower section of the load lock chamber 20.

The following operation methods can be performed.

Guiding the nitrogen gas 21C into the pod 2 by the louver 21D, while the in-process transfer device is carrying out the pod 2 from the load port 14, causes the nitrogen gas 21C to forcibly purge the atmosphere (air and foreign objects, etc.) within the pod 2. The pod opener 23 then attaches the door 4 to the wafer loading and unloading opening 3 of the pod 2.

This operating method can seal the nitrogen gas 21C inside the pod 2 to an even greater degree so that contamination and the forming of a natural oxidation film inside the pod 2 is prevented.

Nitrogen gas 21C can for example still be sealed into the pod 2 even if the atmosphere inside the sub-case 40 is not a nitrogen gas atmosphere.

Moreover, in cases where the wafers 1 inside the pod 2 were mapped prior to attaching the door 4 to the wafer loading and unloading opening 3, then the now mapped pod 2 can be transferred to the next process in a state where the pod 2 is filled with the nitrogen gas 21C.

This preferred example of the pod opener can also be applied to the first embodiment through the fourth embodiment. The same previously described effects are obtained even if this example is applied.

Figure 16:
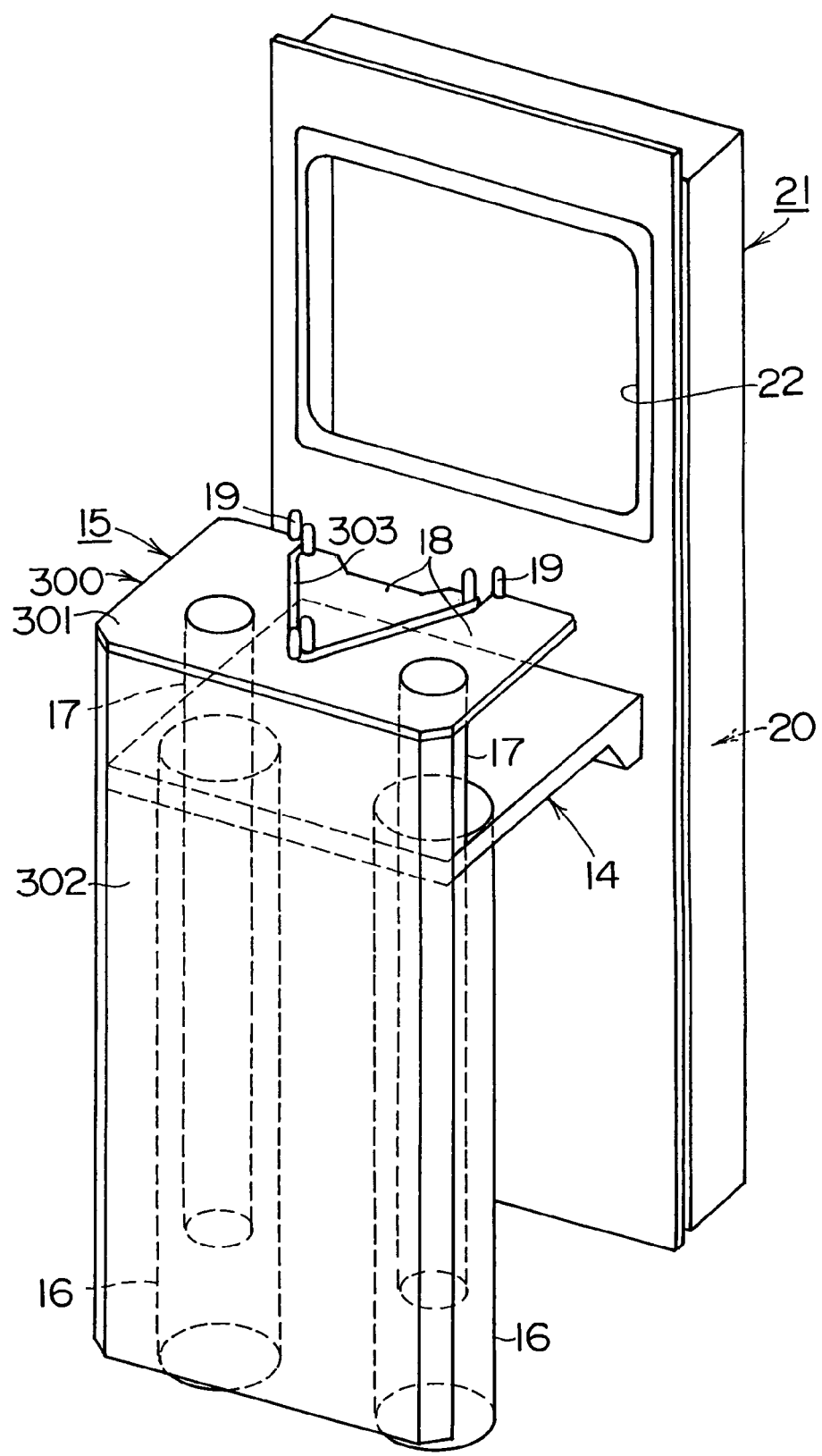
FIG. 16 is a perspective view showing a preferred embodiment of the pod elevator.

FIG. 16 is a perspective view showing a preferred embodiment of the pod elevator.

Figure 17:
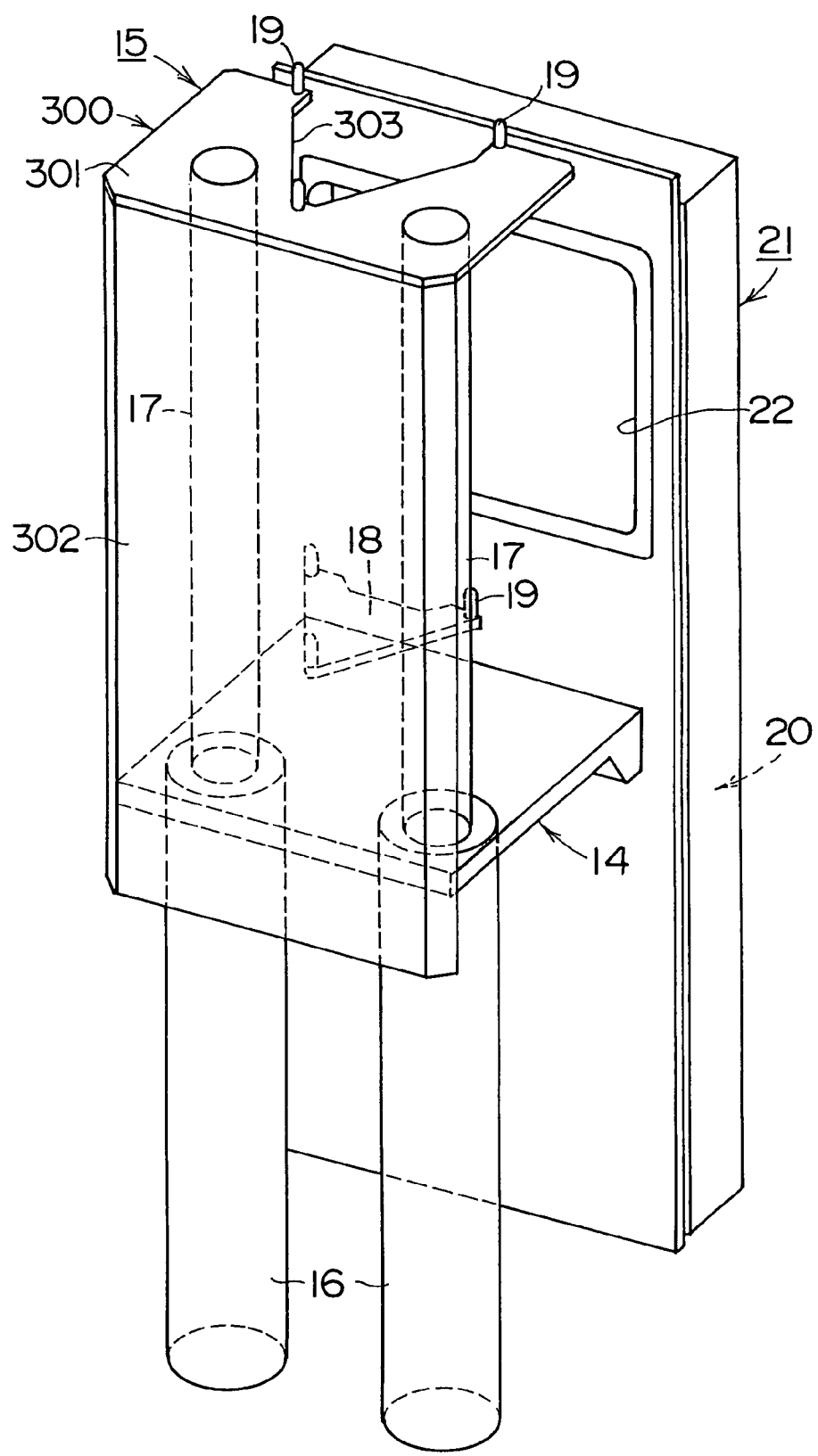
FIG. 17 is a perspective view showing the operating state.

FIG. 17 is a perspective view showing the operating state.

As shown in FIG. 16, a cover 300 is installed on the pod elevator 15. The cover 300 includes a ceiling plate 301 positioned horizontally, and a front plate 302 positioned vertically whose top edge affixed to the front side of the ceiling plate 301. The ceiling plate 301 is affixed to the shaft 17 of the elevator drive unit 16. The front plate 302 has a lateral width capable of covering the load port 14, and is formed higher than the stroke length of the shaft 17 (See FIG. 17).

One elevator drive unit 16 and one shaft 17 are sufficient. Preferably, however, two or more of these components are installed at specified intervals. Installing at specified intervals allows stably raising and lowering the ceiling plate 301 with the pod positioned in place.

A triangular escape hole 303 is formed on the ceiling plate 301 on a section facing the support stand 18 on the load port 14. Kinematic pins 19 are protruded at the respective triangular peaks on the escape hole 303. The ceiling plate 301 therefore functions as a support unit for supporting the lower side of the pod 2, and also a pod mounting unit.

The ceiling plate 301 may be expressed as a support unit, and the cover 300 may be expressed as an item clamped to the support unit.

The cover 300 need not always be clamped to the support unit. A drive device may for example be installed on the cover 300, and raising and lowering then carried out according to the operation of the support unit and elevator mechanism.

The function and effect of the pod elevator configured as above is described next.

Though the pod 2 is omitted from the drawing for the sake of convenience, the ceiling plate 301 scoops up the pod 2 from the support stand 18 when transitioning from the state in FIG. 16 to the state in FIG. 17. The kinematic pins 19 of the ceiling plate 301 at this time are each inserted on the outer side of the kinematic pins 19 of the support stand 18 in the positioning holes 5 on the bottom side of the pod 2.

During the normal standby state, the ceiling plate 301 is positioned below the support stand 18, so that the support stand 18 avoids interfering during backward and forward movement at the door loading and unloading opening 22.

During the transition from the state in FIG. 17 to the state in FIG. 16, the ceiling plate 301 delivers the pod 2 onto the support stand 18.

The cover 300 over the pod elevator 15 prevents particles from the pod elevator 15 from flying outward. In a state in particular where the ceiling plate 301 raised the pod 2 to the vicinity of the pod loading and unloading opening 12, components such as the elevator drive unit 16 and the shaft 17 are exposed from the front surface of the apparatus by the front opening 14C, so particles tend to disperse outward from the apparatus. However, the cover 300 is capable of suppressing these type of particles from dispersing outwards.

Utilizing the cover 300 that covered the pod elevator 15 further prevents hazards to the operator while the elevator drive unit 16 and the shaft 17 are exposed to the work space.

For example, if the operator is placing the pod 2 by hand in the load port 14 from the front opening 14C (See FIG. 1) of the box 14A, then the cover 300 can prevent contact with the elevator drive unit 16 and the shaft 17.

Figure 18:
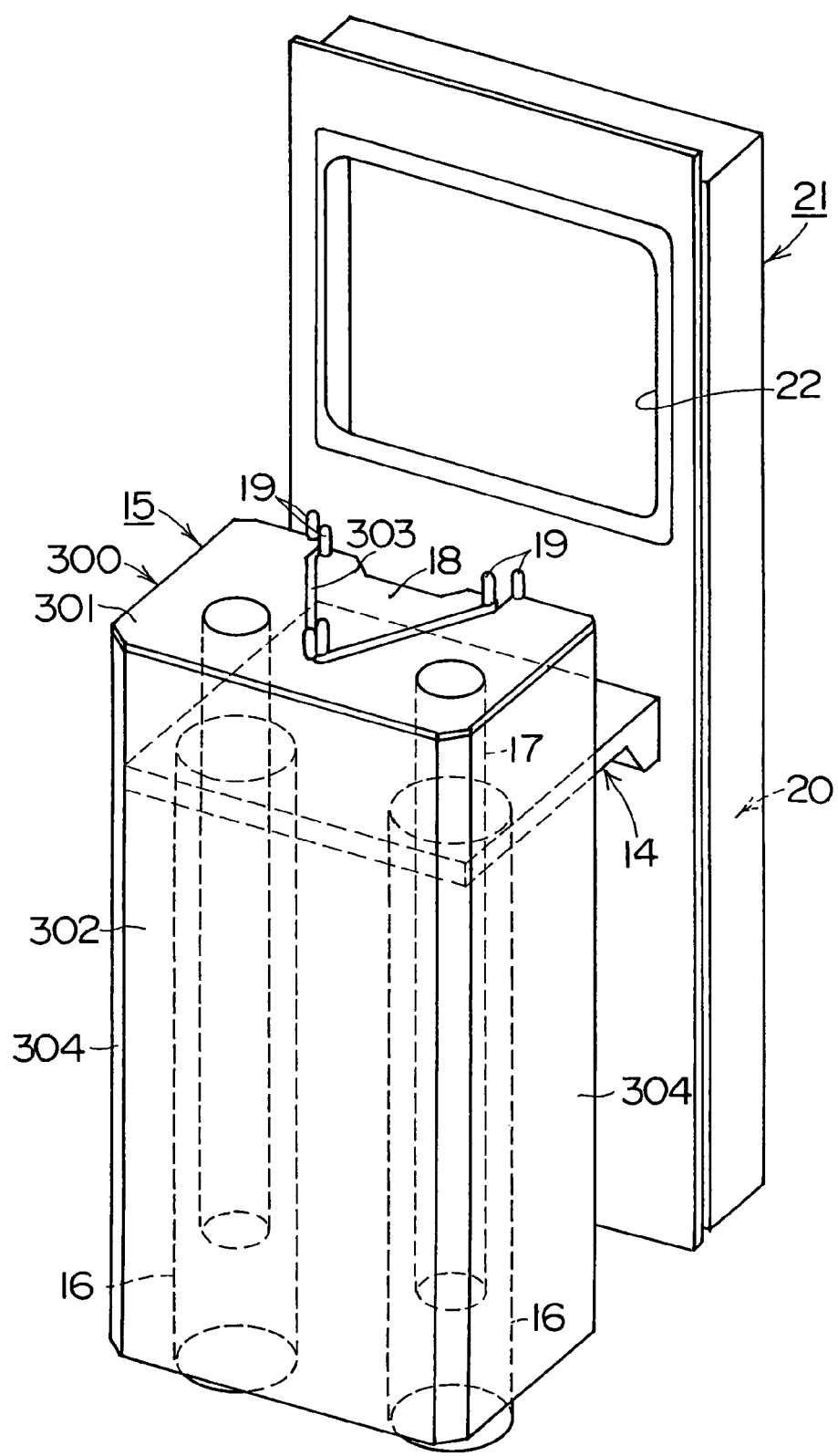
FIG. 18 is a perspective view showing a preferred embodiment of the pod elevator.

FIG. 18 is a perspective view showing a further preferred embodiment of the pod elevator.

Figure 19:
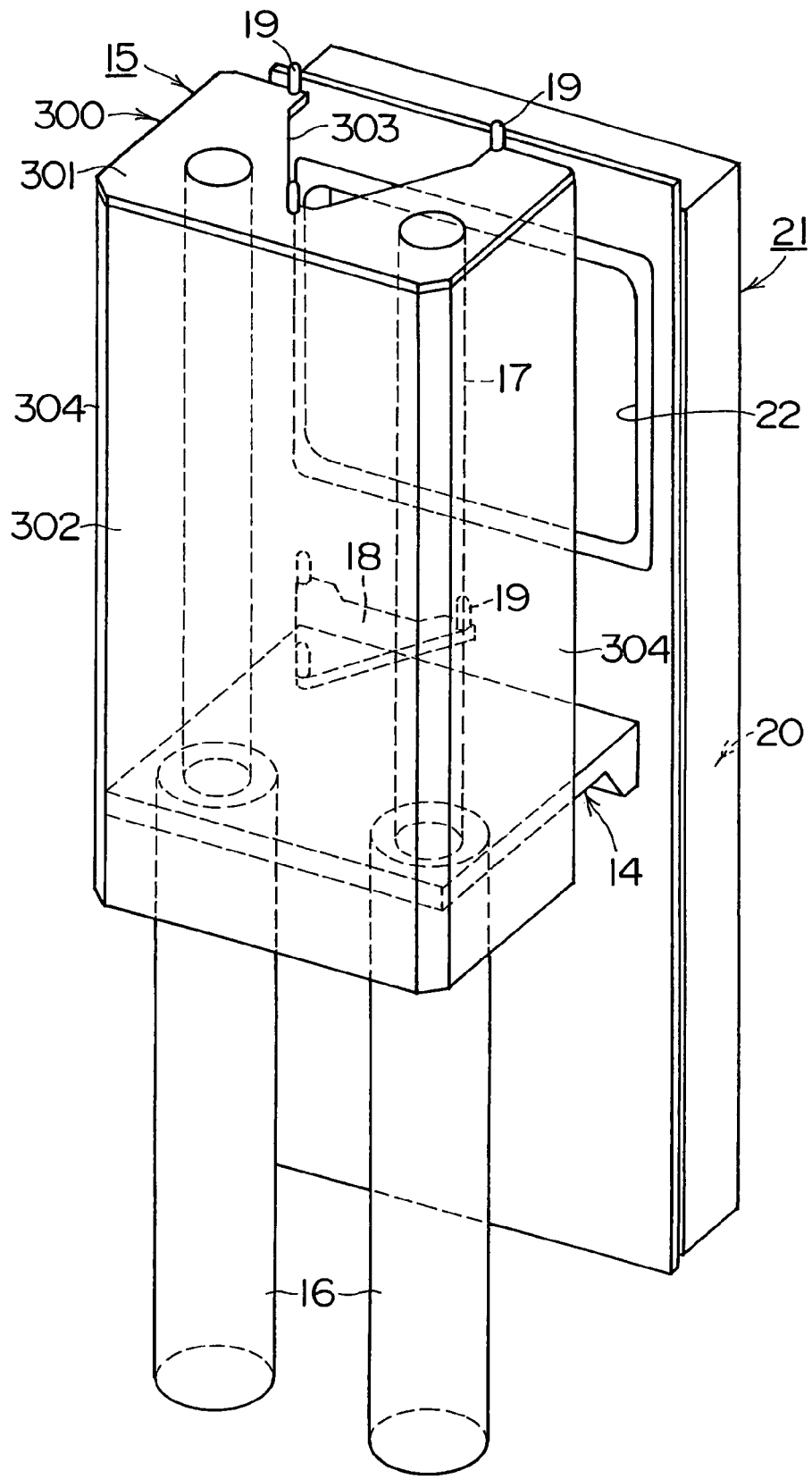
FIG. 19 is a perspective view showing the operating state.

FIG. 19 is a perspective view showing the operating state.

The point where this embodiment differs from the previous embodiments is that the cover 300 includes a pair of side plates 304, 304. This side plate 304, 304 pair are each directly clamped at right angles to both the right and left sides of the front plate 302. In other words, these plates are provided at a three-sided surface except for the side with the pod opener 23.

In this embodiment, the cover 300 covers the right and left sides as well as the front of the pod elevator 15 so that the particle dispersal prevention effect and the safety effect are enhanced even further.

The embodiment with the pod elevator shown in FIG. 16 through FIG. 19 can also be applied to the first embodiment through the fourth embodiment. The same previously described effects are obtained if applied to those embodiments.

The present invention is not limited to these embodiments and needless to say, various changes and adaptations not departing from the spirit and scope of this invention are allowed.

For example, installing a front shutter 13 or forming the pod loading and unloading opening 12 with a smaller opening is preferable for preventing particles from flying outward from the apparatus or maintaining the pod storage chamber in a sealed state. However, a front shutter 13 need not be installed.

Moreover, the pod loading and unloading opening 12 may be formed to the maximum allowable size to essentially open nearly all the divider walls above the pod opener 23 and the sealed case 21.

For example, when the pod elevator 15 has raised the support stand 18 (ceiling plate 301) in advance to a position height where the pod transfer device 35 can have access, the pod then received from the OHT at that position, that pod transfer device 35 may then accept the pod from the support stand 18 without lowering the support stand 18 and opening/closing the door 4.

If this method is utilized, then the range that the OHT lowers can be shortened by the amount that the support stand rises. Further, after the support stand 18 has received the pod from the OHT, there is no need to raise it to a position height where the pod transfer device 35 can have access so that the transfer time can be shorted by that amount.

The grip-type pod transfer device can also be employed in the first embodiment and the second embodiment.

The pod stage mechanism and the second divider wall of the third embodiment may also be employed in the first embodiment and the second embodiment.

In the mapping device, the first embodiment may also be applied to the second embodiment, the third embodiment, and the fourth embodiment. The second embodiment, the third embodiment and the fourth embodiment may also be applied to the first embodiment.

The above embodiments were described as applied to a batch CVD apparatus. However, this invention is not limited to this example, and can also apply to substrate processing apparatus in general including diffusion apparatus, annealing apparatus and oxidation apparatus, etc.

The substrate is not limited to wafers and may for example be photo masks, printed circuit boards, liquid crystal panels, compact disks and magnetic disks, etc.

The preferred aspects of the present invention are described as follows.

(1) A substrate processing apparatus comprising:

a storage container for storing multiple substrates and whose substrate loading and unloading opening is shut by a lid, a loading and unloading port for carrying the storage container into and out of the case, a placement unit for placing the storage container in the loading and unloading port, a storage chamber provided adjacent to the loading and unloading port for storing the storage container, an opening and closing device for opening and closing the substrate loading and unloading opening of the storage container placed in the placement unit, a transfer device containing a holding mechanism for supporting the bottom of the storage container and transferring the storage container supported in the holding mechanism, over the opening and closing device between the inside and outside of the storage chamber, and an elevator mechanism for raising and lowering the placement unit between the placement unit height position where the opening and closing device opens and closes the storage container, and a height position where the transfer device gives and receives the storage container.

(2) A substrate processing apparatus comprising:

a storage container for storing multiple substrates and whose substrate loading and unloading opening is shut by a lid, a loading and unloading port for carrying the storage container into and out of the case, a placement unit for placing the storage container in the loading and unloading port, a storage chamber provided adjacent to the loading and unloading port for storing the storage container, an opening and closing device installed in the storage chamber for opening and closing the substrate loading and unloading opening of the storage container placed in the placement unit, a transfer device for transferring the storage container over the opening and closing device between the inside and the outside of the storage chamber, an elevator mechanism for raising and lowering the placement unit between the placement unit height position when the opening and closing device opens and closes the storage container and a height position where the transfer device gives and receives the storage container, and a controller for controlling the elevator mechanism and the transfer device to give and receive the storage container between the placement unit and the transfer device in a state where the elevator mechanism has raised the placement unit to a position at a height capable of transferring the storage container between the inside and the outside of the storage chamber.

(3) A substrate processing apparatus comprising:

a storage container for storing multiple substrates and whose substrate loading and unloading opening is shut by a lid, a loading and unloading port for carrying the storage container into and out of the case, a placement unit for placing the storage container in the loading and unloading port, an opening and closing device for opening and closing the substrate loading and unloading opening of the storage container placed in the placement unit, a storage rack installed inside the case for storing the storage container, a transfer device installed inside the case for transferring the storage container over the opening and closing device between the storage rack and the placement unit, and an elevator mechanism for raising the placement unit to a position accessible by the transfer device.

(4) The substrate processing apparatus according to the first (1) aspect, comprising an opening and closing chamber for enclosing the opening and closing device and the substrate loading and unloading opening during opening and closing of the storage container, wherein the interior of the opening and closing chamber can be filled with inert gas.

(5) The substrate processing apparatus according to the first (1) aspect, wherein the opening and closing chamber includes a substrate status sensing device.

(6) The substrate processing apparatus according to the fourth (4) aspect, comprising a gas supply line for supplying inert gas into the opening and closing chamber, and an exhaust line for exhausting the opening and closing chamber, wherein the gas supply line is installed on the side opposite the retraction direction when the opening and closing device removes the lid; and the exhaust line is installed on the same side as the retraction direction when the opening and closing device removes the lid.

(7) The substrate processing apparatus according to the sixth (6) aspect, wherein the opening and closing chamber contains a louver between the substrate loading and unloading opening and the gas supply line.

(8) The semiconductor device manufacturing method utilizing the substrate processing apparatus according to the first (1) aspect and comprising the steps of:

carrying the storage container into the loading and unloading port, and placing the storage container in the placement unit, removing the lid by the opening and closing device from the substrate loading and unloading opening of the storage container placed in the placement unit;

attaching the lid by the opening and closing device on the substrate loading and unloading opening of the storage container placed in the placement unit;

raising the placement unit by the elevator mechanism between the height position for the transfer device to give and receive the storage container and the height position of the placement unit during attaching or detaching of the lid;

carrying the storage container held in the holding mechanism by the transfer device, over the opening and closing device and into the storage chamber, and processing the substrate in the processing chamber.

(9) A substrate processing apparatus comprising:

a storage container for storing multiple substrates and whose substrate loading and unloading opening is shut by a lid, a loading and unloading port for carrying the storage container into and out of the case, a placement unit for placing the storage container in the loading and unloading port, a storage chamber provided adjacent to the loading and unloading port for storing the storage container, an opening and closing device for opening and closing the substrate loading and unloading opening of the storage container placed in the placement unit, a divider wall for separating the inside and outside of the storage chamber, an opening formed in the divider wall above the opening and closing device, for carry in and carry out the storage container between the inside and outside of the storage chamber, a transfer device installed in the storage chamber for transferring the storage container from the placement unit by way of the opening, and an elevator mechanism for raising the placement unit to a height where the transfer device can access the storage container placed in the placement unit.

(10) The substrate processing apparatus according to the ninth (9) aspect, comprising a second divider wall provided above the placement unit and facing the placement unit, a second opening formed in the second divider wall, and a second opening and closing device for opening and closing the second opening.

(11) The substrate processing apparatus according to the tenth (10) aspect, wherein the upper side of the second opening and closing device is formed to allow placement of the storage container when the second opening is closed.

(12) The substrate processing apparatus according to the ninth (9) aspect, comprising a second opening and closing device for opening and closing the opening.

(13) The substrate processing apparatus according to the first (1) aspect comprising a prechamber containing a substrate transfer device for transferring the substrate between the storage container and the substrate holding jig when the opening and closing device removes the lid of the storage container, a processing chamber provided adjacent to the prechamber for processing the substrate held in the substrate holding jig, and a storage chamber provided adjacent to the prechamber and containing a storage rack and the transfer device.

(14) A semiconductor device manufacturing method comprising the steps of:

carrying a storage container into a loading and unloading port, and placing the storage container in a placement unit, removing a lid by an opening and closing device from a substrate loading and unloading opening of the storage container placed in the placement unit, detecting the substrate layout state within the storage container by a substrate status sensing device, raising the placement unit from the height of the placement unit when the lid is attached or removed, to a height above the opening and closing device for transferring the storage container between the placement unit and the transfer device, holding the storage container by the transfer device, to transfer the storage container from the placement unit to a storage rack, and processing the substrate in the processing chamber.

(15) A substrate processing device comprising:

a storage container for storing multiple substrates and whose substrate loading and unloading opening is shut by a lid, a loading and unloading port for carrying the storage container into and out of the case, a placement unit for placing the storage container in the loading and unloading port, an opening and closing device for opening and closing the substrate loading and unloading opening of the storage container placed in the placement unit, an elevator mechanism for raising and lowering the placement unit between a height position where the opening and closing device can open and close the storage container, and a height position where the storage container can be transferred over the opening and closing device, and a transfer device for transferring the storage container between the transfer device and the placement unit at a height where the storage container can be transferred.

(16) A substrate processing apparatus comprising:

a storage container for storing multiple substrates and whose substrate loading and unloading opening is shut by a lid, a loading and unloading port for carrying the storage container into and out of the case, a placement unit for placing the storage container in the loading and unloading port, an opening and closing device for opening and closing the substrate loading and unloading opening of the storage container placed in the placement unit, an opening and closing chamber for enclosing the opening and closing device, and an elevator mechanism for raising and lowering the placement unit between a height position where the opening and closing device can open and close the storage container, and a height position where at least a section of the storage container placed in the placement unit is higher than the upper edge of the opening and closing chamber.

(17) The substrate processing apparatus according to the sixteenth (16) aspect, comprising a cover for covering the lower section of the placement unit, wherein the cover is raised or lowered according to the operation of the elevator mechanism.

(18) The substrate processing apparatus according to the seventeenth (17) aspect, wherein the cover is placed on the front side of the placement unit.

(19) The substrate processing apparatus according to the seventeenth (17) aspect, wherein the cover is provided at three side surfaces except on the opening and closing device side.

(20) A substrate processing apparatus comprising:

a storage container for storing multiple substrates and whose substrate loading and unloading opening is shut by a lid, a loading and unloading port for carrying the storage container into and out of the case, a placement unit for placing the storage container in the loading and unloading port, an elevator mechanism installed below the placement unit for raising and lowering the placement unit, and a cover installed so as to cover the lower section of the placement unit, and that rises and lowers according to the operation of the elevator mechanism.

(21) A substrate processing apparatus comprising:

a storage container for storing multiple substrates and whose substrate loading and unloading opening is shut by a lid, a loading and unloading port for carrying the storage container into and out of the case, a placement unit for placing the storage container in the loading and unloading port, a storage chamber installed in the case for storing the storage container, an opening and closing device for opening and closing the substrate loading and unloading opening of the storage container placed in the placement unit, a transfer device containing a holding mechanism for supporting the bottom of the storage container and transferring the storage container supported in the holding mechanism, over the opening and closing device between the inside and outside of the storage chamber, an elevator mechanism for raising and lowering the placement unit between the placement unit height position when the opening and closing device opens and closes the storage container and a height position where the transfer device gives and receives the storage container, and a controller for controlling the elevator mechanism and the transfer device so that the storage container is transferred between the transfer device and the placement unit, in a state where the elevator mechanism has raised the placement unit to a position at a height where the storage container held on the bottom surface by the holding mechanism can be transferred.

(22) A semiconductor device manufacturing method utilizing the substrate processing apparatus according to the sixteenth (16) aspect and comprising the steps of:

carrying the storage container into the loading and unloading port and placing the storage container in the placement unit, raising or lowering the placement unit by the elevator mechanism between a height position where at least a section of the storage container placed in the placement unit is higher than the upper edge of the opening and closing chamber, and a height position of the placement unit during attaching or detaching of the lid, and processing the substrate in the processing chamber.

(23) The substrate processing apparatus according to the sixteenth (16) aspect, comprising a controller for controlling the transfer device and the elevator mechanism so that the storage container is transferred between the transfer device and the placement unit, in a state where the elevator mechanism has raised the placement unit to a height where the storage container can be transferred.

(24) A semiconductor device manufacturing method utilizing a substrate processing apparatus according to the first (1) aspect or the sixteenth (16) aspect and comprising the steps of:

carrying the storage container into the loading and unloading port and placing the storage container in the placement unit, raising or lowering the placement unit by the elevator mechanism, and processing the substrate in the processing chamber.

The invention claimed is:

1. A substrate processing apparatus comprising:
a storage container for storing multiple substrates and whose substrate loading and unloading opening is shut by a lid,
a loading and unloading port in the case for carrying the storage container into and out of a case,
a placement unit for placing the storage container in the loading and unloading port,
a storage chamber provided adjacent to the loading and unloading port for storing the storage container,
an opening and closing device for opening and closing the substrate loading and unloading opening of the storage container placed in the placement unit,
a transfer device containing a holding mechanism for supporting the bottom of the storage container and transferring the storage container supported in the holding mechanism, over the opening and closing device between the inside and outside of the storage chamber,
an elevator mechanism for raising and lowering the placement unit between the placement unit height position where the opening and closing device opens and closes the storage container, and a height position where the transfer device gives and receives the storage container, and
an opening and closing chamber for enclosing the opening and closing device and the substrate loading and unloading opening during opening and closing of the storage container, wherein the interior of the opening and closing chamber can be filled with inert gas.

2. The substrate processing apparatus according to claim 1, wherein the opening and closing chamber includes a substrate status sensing device.

3. The substrate processing apparatus according to claim 1, comprising a gas supply line for supplying inert gas into the opening and closing chamber, and an exhaust line for exhausting the opening and closing chamber, wherein the gas supply line is installed on the side opposite the retraction direction when the opening and closing device removes the lid; and the exhaust line is installed on the same side as the retraction direction when the opening and closing device removes the lid.

4. The substrate processing apparatus according to claim 3, wherein the opening and closing chamber contains a louver between the substrate loading and unloading opening and the gas supply line.

5. A substrate processing apparatus comprising:
a storage container for storing multiple substrates and whose substrate loading and unloading opening is shut by a lid,
a loading and unloading port in the case for carrying the storage container into and out of a case,
a placement unit for placing the storage container in the loading and unloading port,
a storage chamber provided adjacent to the loading and unloading port for storing the storage container,
an opening and closing device for opening and closing the substrate loading and unloading opening of the storage container placed in the placement unit,
a transfer device containing a holding mechanism for supporting the bottom of the storage container and transferring the storage container supported in the holding mechanism, over the opening and closing device between the inside and outside of the storage chamber,
an elevator mechanism for raising and lowering the placement unit between the placement unit height position where the opening and closing device opens and closes the storage container, and a height position where the transfer device gives and receives the storage container, and
a second divider wall provided above the placement unit and facing the placement unit, a second opening formed in the second divider wall, and a second opening and closing device for opening and closing the second opening, and an opening and closing chamber for enclosing the opening and closing device and the substrate loading and unloading opening during opening and closing of the storage container, wherein the interior of the opening and closing chamber can be filled with inert gas.

6. The substrate processing apparatus according to claim 5, wherein the upper side of the second opening and closing device is formed to allow placement of the storage container when the second opening is closed.

7. The substrate processing apparatus according to claim 5, comprising a second opening and closing device for opening and closing the opening.

8. A substrate processing apparatus comprising:
a storage container for storing multiple substrates and whose substrate loading and unloading opening is shut by a lid,
a loading and unloading port in the case for carrying the storage container into and out of a case,
a placement unit for placing the storage container in the loading and unloading port,
a storage chamber provided adjacent to the loading and unloading port for storing the storage container,
an opening and closing device for opening and closing the substrate loading and unloading opening of the storage container placed in the placement unit,
a transfer device containing a holding mechanism for supporting the bottom of the storage container and transferring the storage container supported in the holding mechanism, over the opening and closing device between the inside and outside of the storage chamber,
an elevator mechanism for raising and lowering the placement unit between the placement unit height position where the opening and closing device opens and closes the storage container, and a height position where the transfer device gives and receives the storage container, and
a prechamber containing a substrate transfer device for transferring the substrate between the storage container and a substrate holding jig when the opening and closing device removes the lid of the storage container, a processing chamber provided adjacent to the prechamber for processing the substrate held in the substrate holding jig, and a further storage chamber provided adjacent to the prechamber and containing a storage rack and the transfer device.

* * * * *